(12) United States Patent
Mizuno et al.

(10) Patent No.: US 10,510,638 B2
(45) Date of Patent: Dec. 17, 2019

(54) ELECTRONIC COMPONENT-EMBEDDED BOARD

(71) Applicant: SHINKO ELECTRIC INDUSTRIES CO., LTD., Nagano-shi, Nagano (JP)

(72) Inventors: Shigeru Mizuno, Nagano (JP); Tomoya Kubo, Nagano (JP); Katsuya Fukase, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/138,147

(22) Filed: Sep. 21, 2018

(65) Prior Publication Data

US 2019/0103335 A1    Apr. 4, 2019

(30) Foreign Application Priority Data

Oct. 3, 2017  (JP) ................. 2017-193349

(51) Int. Cl.
| | | |
|---|---|---|
| H01L 23/34 | (2006.01) | |
| H01L 23/367 | (2006.01) | |
| H01L 23/538 | (2006.01) | |
| H01L 21/48 | (2006.01) | |

(52) U.S. Cl.
CPC ........ *H01L 23/3675* (2013.01); *H01L 21/486* (2013.01); *H01L 21/4857* (2013.01); *H01L 21/4882* (2013.01); *H01L 23/5383* (2013.01); *H01L 23/5386* (2013.01); *H01L 23/5389* (2013.01)

(58) Field of Classification Search
CPC ............... H01L 21/486; H01L 21/4882; H01L 23/3675; H01L 23/5383; H01L 23/5386; H01L 23/5389
USPC ........................................................ 257/713
See application file for complete search history.

(56) References Cited

U.S. PATENT DOCUMENTS

| | | | |
|---|---|---|---|
| 2003/0058630 | A1 | 3/2003 | Takano et al. |
| 2011/0175213 | A1* | 7/2011 | Mori ............... H01L 23/13 257/675 |
| 2019/0043847 | A1* | 2/2019 | Lee ............... H01L 25/18 |
| 2019/0139853 | A1* | 5/2019 | Oh ............... H01L 23/367 |

FOREIGN PATENT DOCUMENTS

| | | |
|---|---|---|
| JP | 2003-101243 | 4/2003 |
| JP | 2008-288607 | 11/2008 |

\* cited by examiner

*Primary Examiner* — David S Blum
(74) *Attorney, Agent, or Firm* — Rankin, Hill & Clark LLP

(57) ABSTRACT

There is provided an electronic component-embedded board. The electronic component-embedded board includes: a first insulating layer; a metal layer formed on the first insulating layer; a first electronic component disposed on the metal layer; a second insulating layer formed on the first insulating layer and the metal layer such that the first electronic component is buried in the second insulating layer; a second electronic component disposed above the second insulating layer; and a heat radiating member thermally connected to the metal layer exposed from the second insulating layer and thermally connected to the second electronic component.

9 Claims, 27 Drawing Sheets

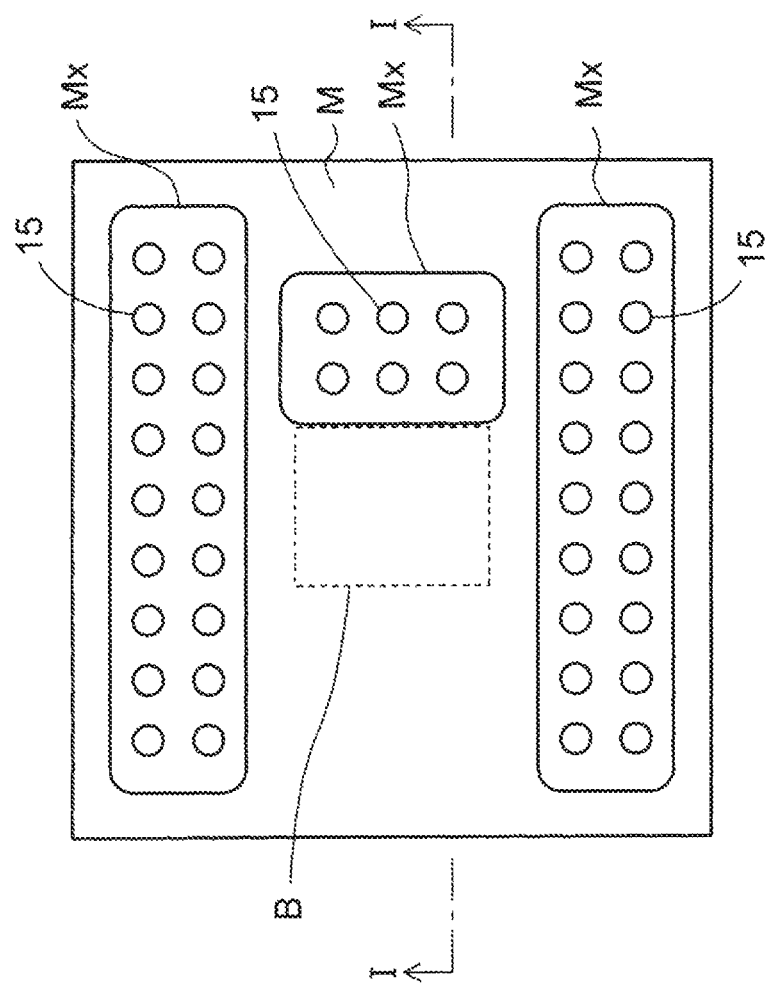

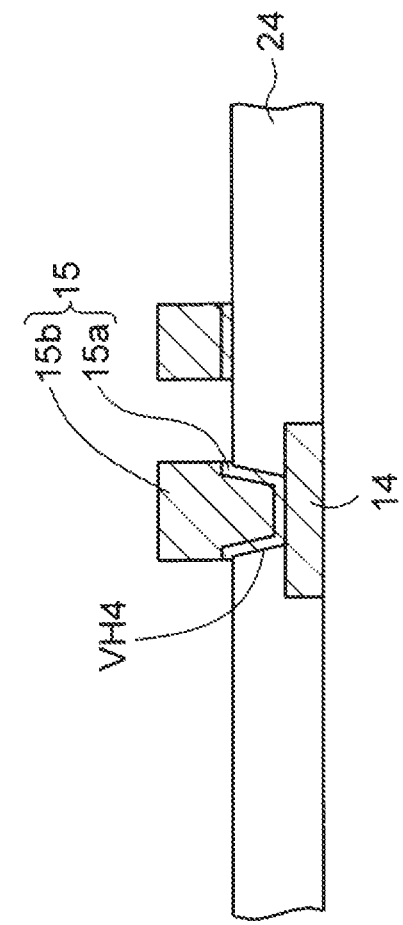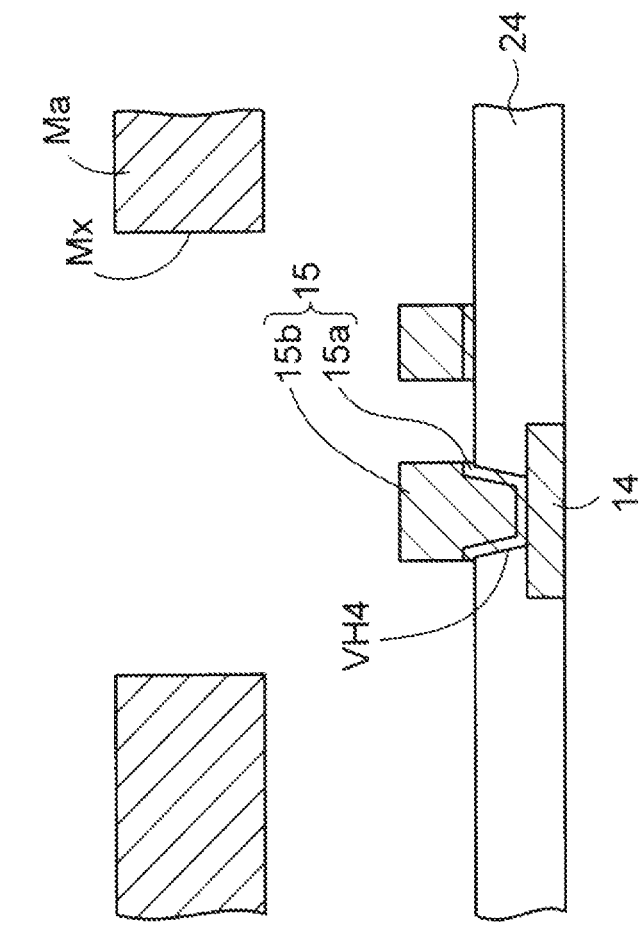
FIG.10A
FIG.10B

ELECTRONIC COMPONENT-EMBEDDED BOARD

This application claims priority from Japanese Patent Application No. 2017-193349 filed on Oct. 3, 2017, the entire contents of which are herein incorporated by reference.

BACKGROUND

1. Technical Field

The present disclosure relates to an electronic component-embedded board.

2. Background Art

In the background art, there are electronic component-embedded boards in which electronic components such as capacitors are embedded in wiring substrates. In such an electronic component-embedded board, after an electronic component is mounted on a wiring substrate, the electronic component is buried in an insulating layer and a wiring layer is connected to the electronic component (see e.g., JP-A-2003-101243 and JP-A-2008-288607).

As will be described in an undermentioned preliminary matter, there are some electronic component-embedded boards in which electronic components generating heat are buried and embedded in insulating layers. In such an electronic component-embedded board, heat generated from an electronic component cannot be radiated satisfactorily. Therefore, the electronic component may be broken down due to a rise of its own temperature caused by the generated heat.

SUMMARY

Certain embodiments provide an electronic component-embedded board. The electronic component-embedded board comprises: a first insulating layer; a metal layer formed on the first insulating layer; a first electronic component disposed on the metal layer; a second insulating layer formed on the first insulating layer and the metal layer such that the first electronic component is buried in the second insulating layer; a second electronic component disposed above the second insulating layer; and a heat radiating member thermally connected to the metal layer exposed from the second insulating layer and thermally connected to the second electronic component.

BRIEF DESCRIPTION OF DRAWINGS

FIG. 3 is a reduced plan view of the wiring member of FIG. 2 when seen from the above;

FIGS. 10A and 10B are sectional views showing a formation method of a wiring layer and a metal layer in the wiring member of FIG. 9 (Part 1);

DETAILED DESCRIPTION

An embodiment will be described below with reference to the accompanying drawings.

A preliminary matter underlying the embodiment will be described prior to description of the embodiment. Description of the preliminary matter is about the details of personal study of the present inventor, that contain techniques not belonging to known techniques.

Figure 1:
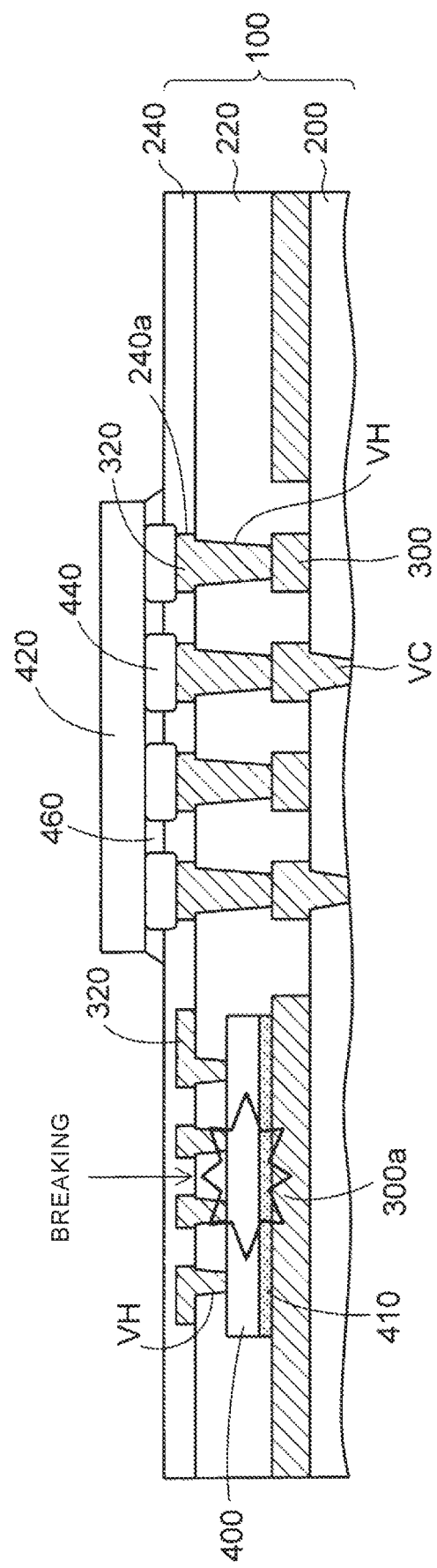
FIG. 1 is a sectional view for explaining a problem of an electronic component-embedded board according to a preliminary matter.

FIG. 1 is a view for explaining a problem inherent in an electronic component-embedded board according to the preliminary matter. As shown in FIG. 1, the electronic component-embedded board according to the preliminary matter is provided with a wiring substrate 100. In FIG. 1, an upper portion of the wiring substrate 100 is partially shown.

In the wiring substrate 100, a wiring layer 300 and a metal layer 300a are formed on an insulating layer 200. The wiring layer 300 and the metal layer 300a are formed out of the same copper layer. The metal layer 300a is used as a heat radiation route of a semiconductor chip and formed from a plain pattern (solid pattern).

A lower surface (back surface) of a first semiconductor chip 400 is adhesively bonded on the metal layer 300a by an adhesive layer 410. In addition, an insulating layer 220 is formed on the wiring layer 300 and the metal layer 300a so that the first semiconductor chip 400 is buried in the insulating layer 220.

Via holes VH are formed in the insulating layer 220 to reach the wiring layer 300 and connection terminals of the first semiconductor chip 400.

Further, a wiring layer 320 is formed on the insulating layer 220. The wiring layer 320 is connected to the wiring layer 300 and the connection terminals of the first semiconductor chip 400 through via conductors inside the via holes VH respectively.

In addition, a solder resist layer 240 provided with opening portions 240a on the wiring layer 320 is formed on the insulating layer 220.

In addition, bump electrodes 440 of a second semiconductor chip 420 are flip-chip connected to the wiring layer 320. Further, a space on a lower side of the second semiconductor chip 420 is filled with an underfill resin 460.

In this manner, the first semiconductor chip 400 is buried in the insulating layer 220 to be embedded in the wiring substrate 100. The first semiconductor chip 400 is a CPU chip that generates heat during operation.

In the background art, a passive element such as a capacitor that does not generate heat is embedded in a wiring substrate. However, recently, there is a demand for embedding a heat-generating CPU chip etc. into a wiring substrate in order to satisfy a request of higher performance of an electronic device, miniaturization of the electronic device owing to higher density mounting, etc.

The first semiconductor chip 400 is disposed on the metal layer 300a. Heat generated from the first semiconductor chip 400 is radiated to the outside through the metal layer 300a (copper layer).

However, since an amount of heat generated by the first semiconductor chip 400 (CPU chip) is large, the heat cannot be radiated satisfactorily only through the metal layer 300a (copper layer). Therefore, the temperature of the first semiconductor chip (CPU chip) 400 rises due to the heat. As a result, an element in the first semiconductor chip 400 is broken down and does not work.

Thus, in the electronic component-embedded board in which the heat-generating CPU chip etc. is embedded in the wiring substrate, there is a demand for a structure which can satisfactorily radiate the heat generated from the CPU chip or the like.

The aforementioned problem can be solved by an electronic component-embedded board and a manufacturing method thereof according to an embodiment which will be described below.

Embodiment

Figure 25:
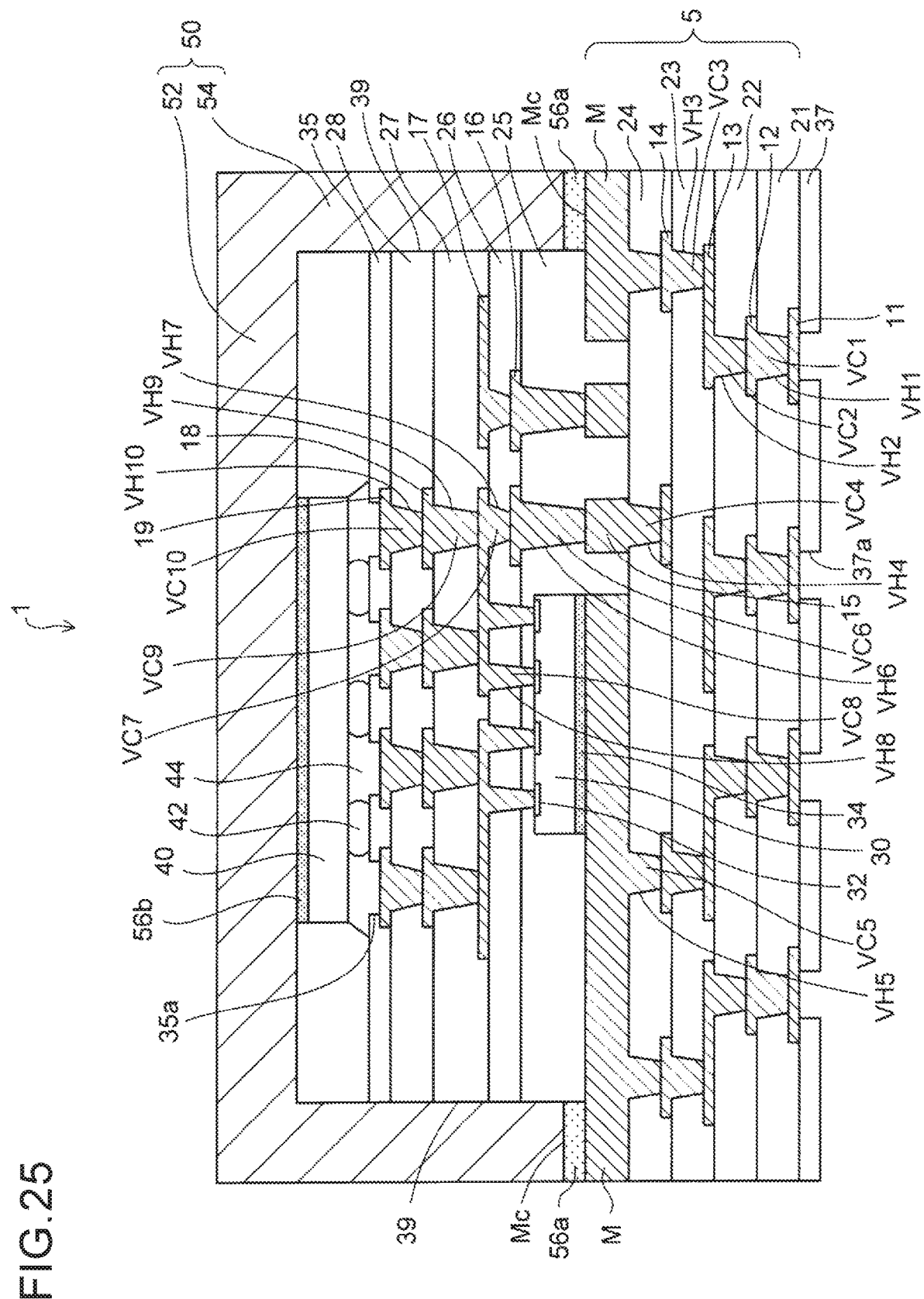
FIG. 25 is a sectional view showing the electronic component-embedded board according to the embodiment.
Figure 26:
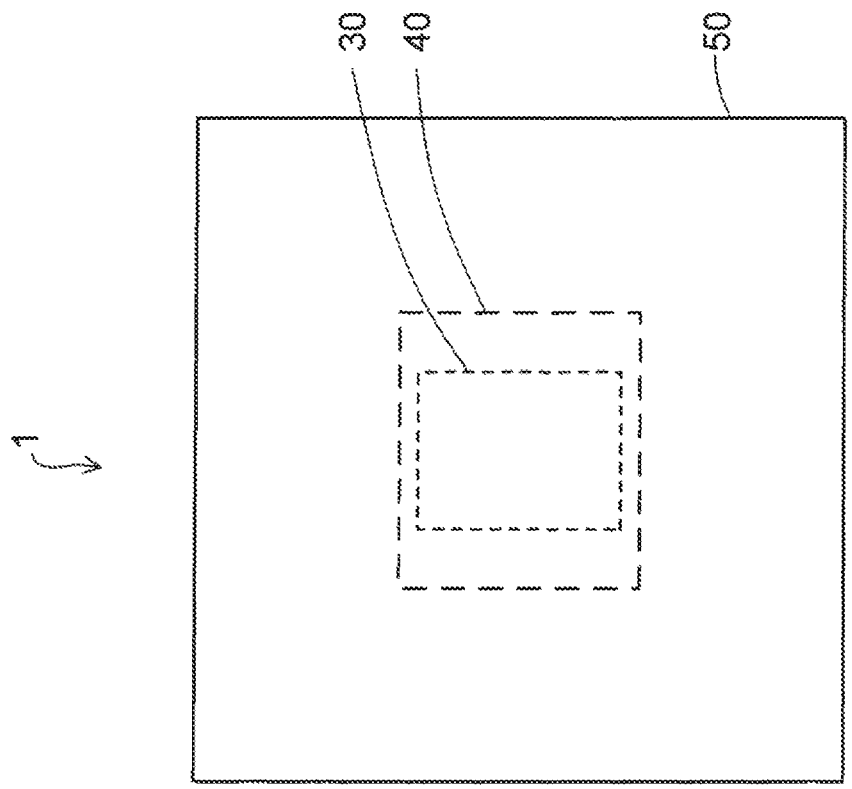
FIG. 26 is a plan view showing the electronic component-embedded board according to the embodiment.
Figure 27:
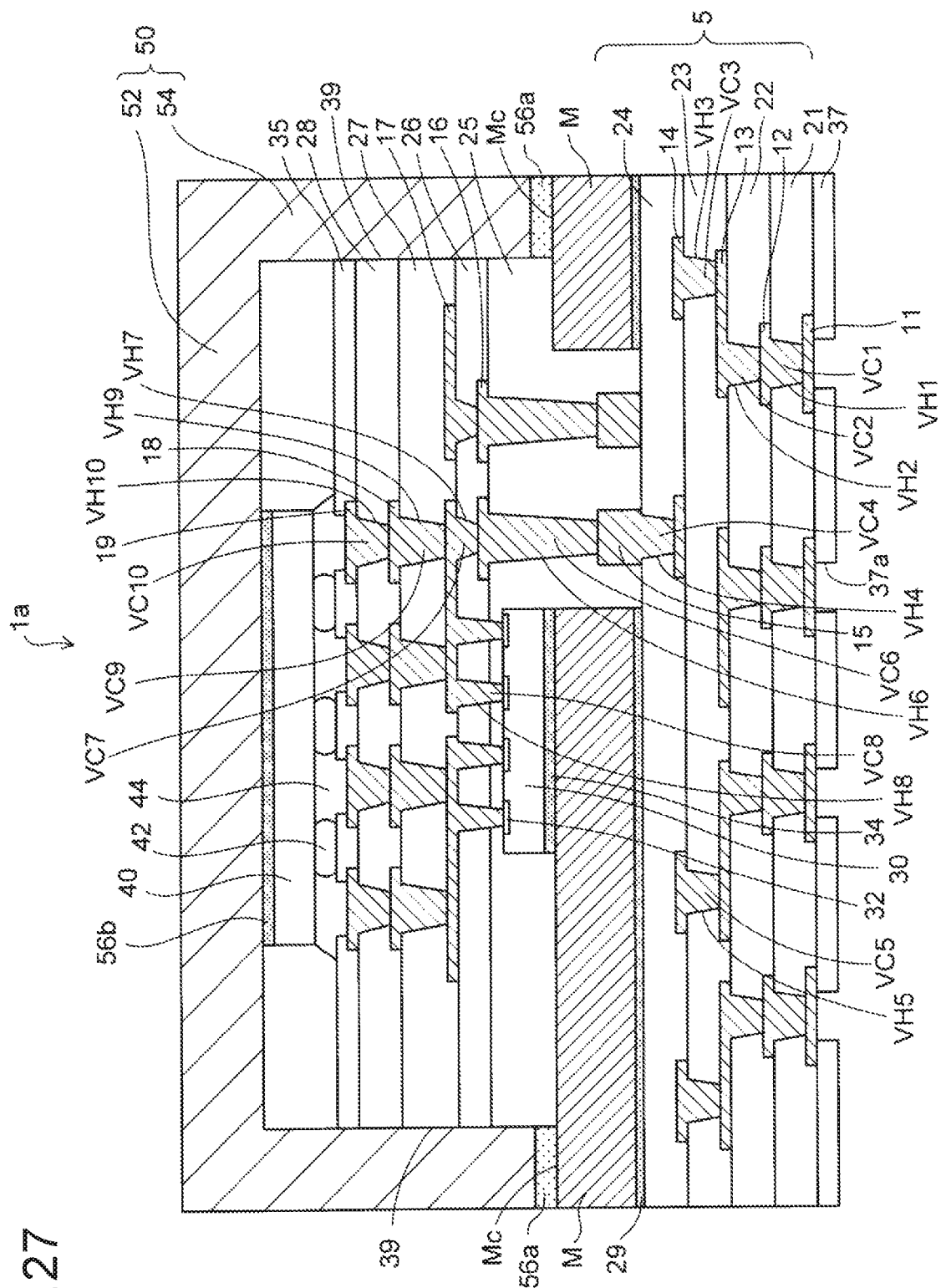
FIG. 27 is a sectional view showing another electronic component-embedded board according to the embodiment.

FIG. 2 to FIG. 24 are views for explaining the manufacturing method of the electronic component-embedded board according to the embodiment. FIGS. 25 to 27 are views showing the electronic component-embedded board according to the embodiment.

The structure of the electronic component-embedded board will be described below while the manufacturing method of the electronic component-embedded board is described.

Figure 2:
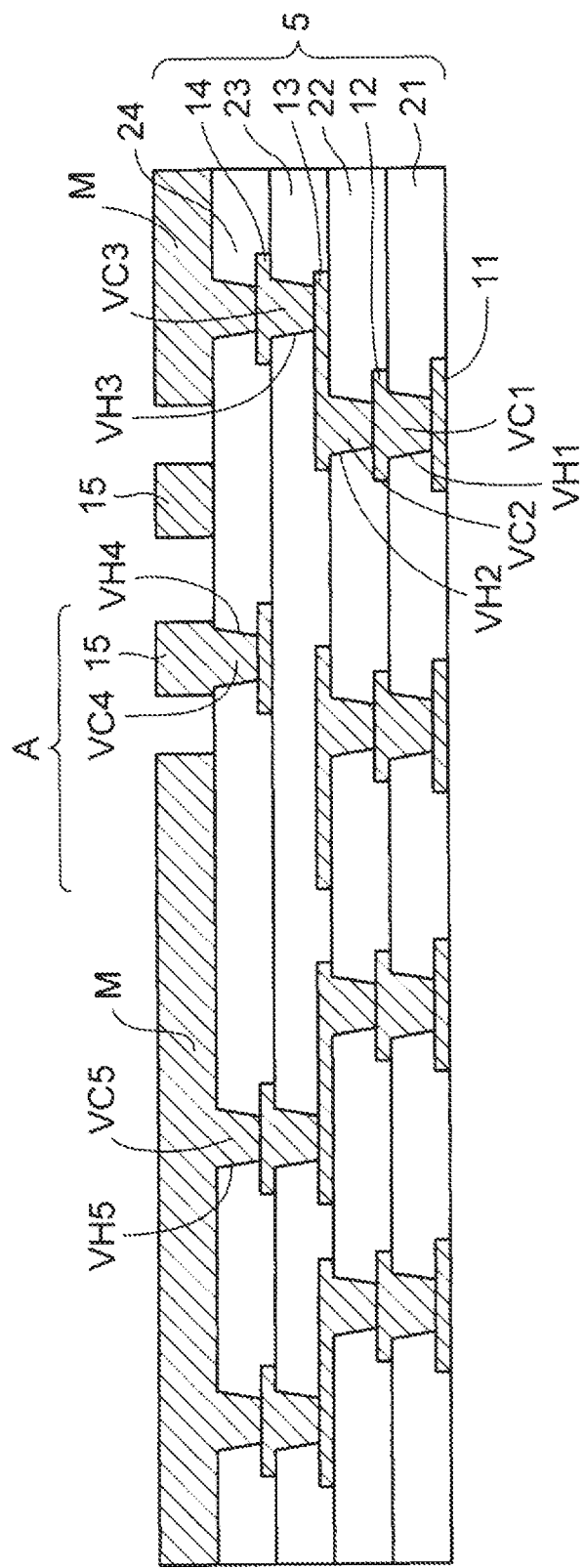
FIG. 2 is a sectional view showing a wiring member that is used in a manufacturing method of an electronic component-embedded board according to an embodiment.

In the manufacturing method of the electronic component-embedded board according to the embodiment, first, a wiring member 5 is prepared, as shown in FIG. 2. The wiring member 5 is an intermediate member in production in order to manufacture the electronic component-embedded board.

The wiring member 5 has a wiring layer 11 provided at its bottom, and an insulating layer 21 formed on the wiring layer 11. The insulating layer 21 is formed to cover an upper surface and side surfaces of the wiring layer 11. A lower surface of the wiring layer 11 is exposed from the insulating layer 21. The lower surface of the wiring layer 11 is flush with a lower surface of the insulating layer 21.

Via holes VH1 are formed in the insulating layer 21 to reach the wiring layer 11. Further, a wiring layer 12 is formed on the insulating layer 21. The wiring layer 12 is connected to the wiring layer 11 through via conductors VC1 inside the via holes VH1.

In addition, an insulating layer 22 is formed on the insulating layer 21 and the wiring layer 12. Second via holes VH2 are formed in the insulating layer 22 to reach the wiring layer 12.

A wiring layer 13 is formed on the insulating layer 22. The wiring layer 13 is connected to the wiring layer 12 through via conductors VC2 inside the via holes VH2.

In addition, an insulating layer 23 is formed on the insulating layer 22 and the wiring layer 13 in a similar manner or the same manner. Via holes VH3 are formed in the insulating layer 23 to reach the wiring layer 13.

A wiring layer 14 is formed on the insulating layer 23. The wiring layer 14 is connected to the wiring layer 13 through via conductors VC3 inside the via holes VH3.

Further, an insulating layer 24 is formed on the insulating layer 23 and the wiring layer 14 in a similar manner or the same manner. Via holes VH4 are formed in the insulating layer 24 to reach the wiring layer 14. Wiring layers 15 are formed on the insulating layer 24. The wiring layers 15 are connected to the wiring layer 14 through via conductors VC4 inside the via holes VH4. In addition, a metal layer M is formed on the insulating layer 24. The insulating layer 24 is an example of a first insulating layer.

FIG. 3 is a reduced plan view of FIG. 2 when seen from above. FIG. 2 corresponds to a section taken along a line I-I of FIG. 3.

As shown in FIG. 3, each of the wiring layers 15 is formed as an island-like pad. Opening portions Mx are formed inside the metal layer M. The wiring layers 15 are disposed inside the opening portions Mx. A plurality of wiring layers 15 are disposed in each of the three opening portions Mx of the metal layer M. The wiring layers 15 and the metal layer M are formed from one and the same layer.

As will be described later, an electronic component that generates heat during operation is disposed on a region B of the metal layer M designated by a broken line in FIG. 3. The metal layer M is used as a portion of a heat radiation route along which the heat generated from the electronic component can be radiated.

Therefore, the metal layer M is formed into an integral plain pattern (solid pattern) of a wide area in order to increase the area or the volume of the metal layer M. Each of film thicknesses of each wiring layer 15 and the metal layer M is set at about 40 μm to about 50 μm. The wiring layer 15 is an example of a first wiring layer.

As shown in FIG. 2, the metal layer M is connected to the lower-side wiring layer 14 through via conductors VC5 inside via holes VH5. The metal layer M also functions as a ground layer.

A formation method of the wiring layers 15 and the metal layer M in the wiring member 5 of FIG. 2 will be described below. The wiring layers 15 and the metal layer M are formed, preferably, by a semi-additive method.

FIG. 4A to FIG. 5C are partial enlarged sectional views showing a state in which one of the wiring layers 15 and the metal layer M are formed in a region designated by A in FIG. 2.

Figure 4A:
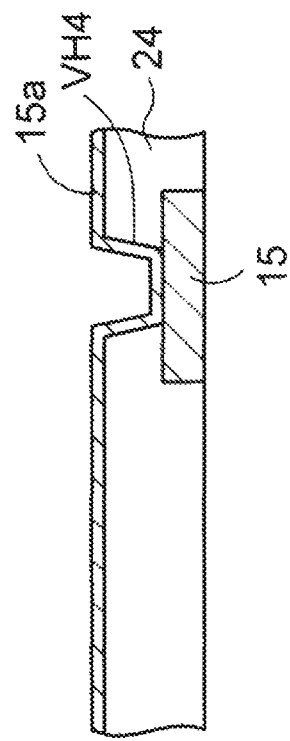
FIGS. 4A and 4B are sectional views showing a formation method of a wiring layer and a metal layer in the wiring member of FIG. 2 (Part 1)

As shown in FIG. 4A, a seed layer 15a made of copper etc. is formed inside the via holes VH4 and VH5 (FIG. 2) and on the insulating layer 24. The seed layer 15a is formed by an electroless plating method or a sputter method.

Figure 4B:
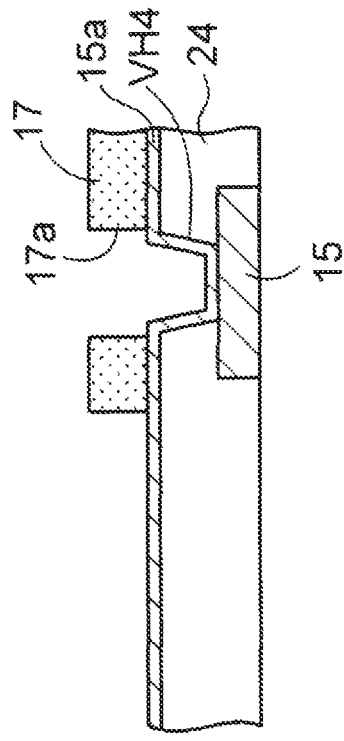

Next, as shown in FIG. 4B, a plating resist layer 17 provided with opening portions 17a in regions where the wiring layers 15 and the metal layer M should be formed is formed on the insulating layer 24. The plating resist layer 17 is exposed to light and developed based on photolithography to be thereby patterned.

Figure 5A:
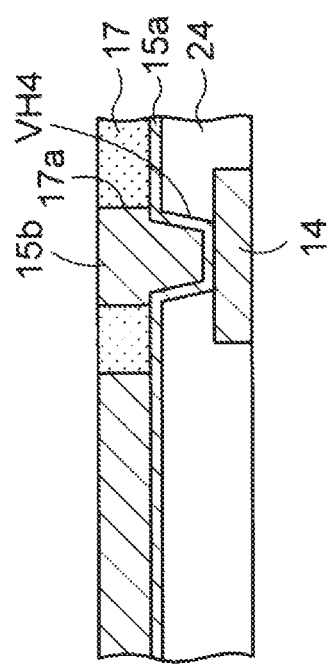
FIGS. 5A to 5C are sectional views showing the formation method of the wiring layer and the metal layer in the wiring member of FIG. 2 (Part 2)

Successively, as shown in FIG. 5A, a metal plating layer 15b made of copper etc. is formed to fill up the opening portions 17a of the plating resist layer 17 from the inside of the via holes VH4 and VH5 by electrolytic plating using the seed layer 15a as a plating power feed route.

Figure 5B:
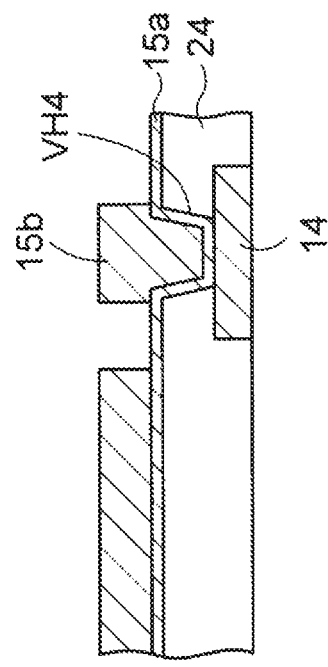
Figure 5C:
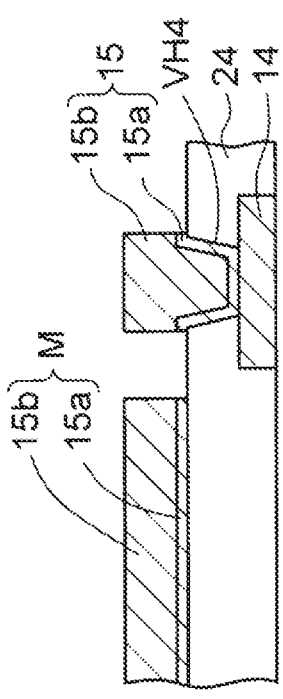

Then, as shown in FIG. 5B, the plating resist layer 17 is removed. Further, as shown in FIG. 5C, the seed layer 15a is removed by etching with the metal plating layer 15b as a mask.

Thus, the wiring layers 15 and the metal layer M are obtained. Each of the wiring layers 15 and the metal layer M is formed from the seed layer 15a and the metal plating layer 15b disposed on the seed layer 15a. Thus, the wiring layers 15 and the metal layer M are formed from the same layers.

As described above, the wiring layers 15 are simultaneously formed on the insulating layer 24 in the step of forming the metal layer M on the insulating layer 24.

The aforementioned wiring layers 11, 12, 13 and 14 in the wiring member 5 of FIG. 2 and a wiring layer in any subsequent step are also formed by a similar method to or the same method as the method of FIGS. 4A to 5C.

Figure 6:
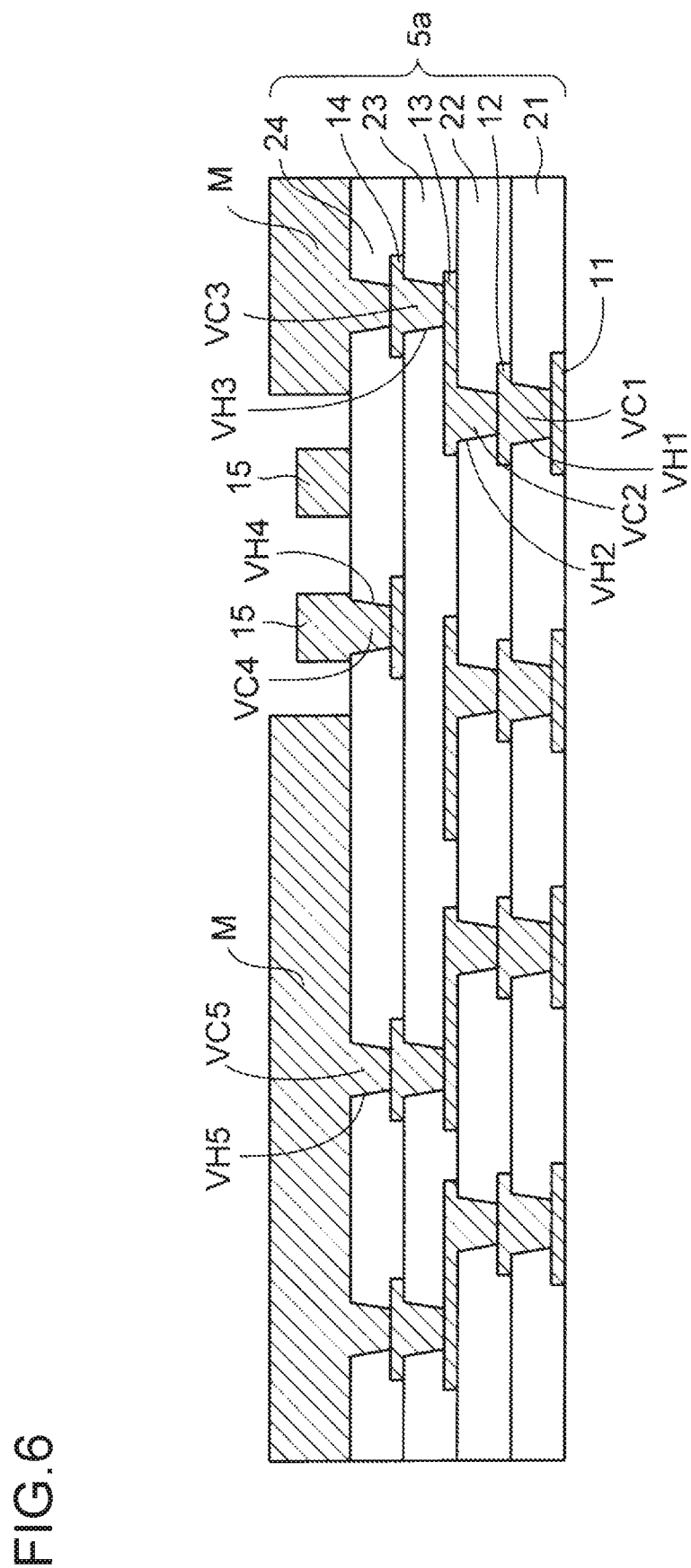
FIG. 6 is a sectional view showing a wiring member of a first modification that is used in the manufacturing method of an electronic component-embedded board according to the embodiment.

In FIG. 6, a wiring member 5a according to a first modification 1 is shown. A metal layer M is used as a heat radiation route, as described above. Accordingly, the metal layer M thicker in thickness can improve heat radiation performance.

Therefore, in the wiring member 5a according the first modification in FIG. 6, the metal layer M is set to be thicker in thickness than wiring layers 15. In FIG. 6, all constituent members except the thickness of the metal layer M are the same as those in the aforementioned FIG. 2.

Figure 7A:
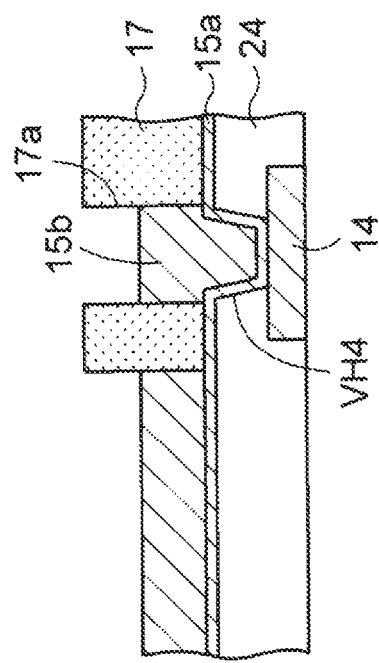
FIGS. 7A and 7B are sectional views showing a formation method of a wiring layer and a metal layer in the wiring member of FIG. 6 (Part 1)

A formation method of the wiring layers 15 and the metal layer M in the wiring member 5a according to the first modification will be described below. First, similar steps to or the same steps as the aforementioned steps in FIGS. 4A to 5A are executed, as shown in FIG. 7A. In the first modification, a plating resist layer 17 is set to be thick in thickness correspondingly to the thickness of the metal layer M. At this point of time, a metal plating layer 15b is formed in the middle of a depth of each of opening portions 17a of the plating resist layer 17.

Figure 7B:
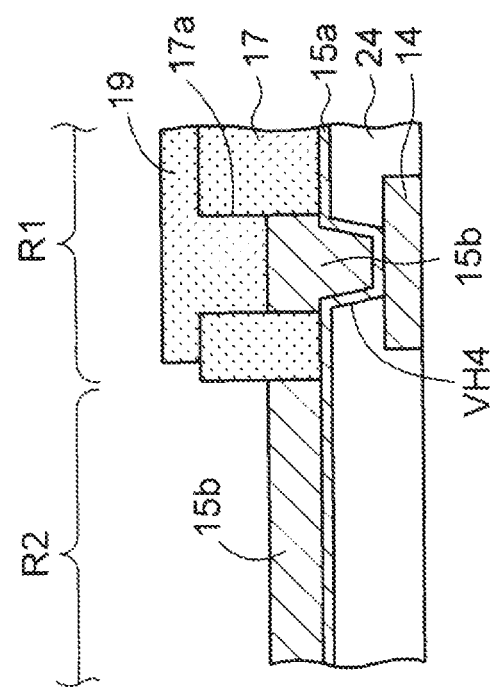

Successively, as shown in FIG. 7B, an auxiliary resist pattern 19 is formed in a region R1 where wiring layers 15 should be disposed. On this occasion, the metal plating layer 15b is exposed from the auxiliary resist pattern 19 in a region R2 where the metal layer M should be disposed.

Figure 8A:
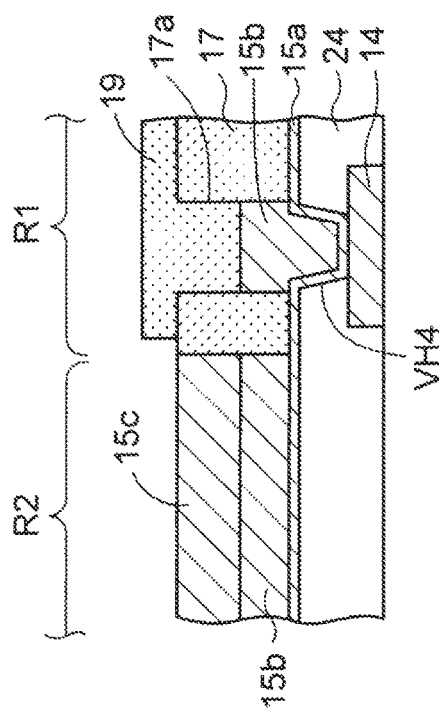
FIGS. 8A to 8C are sectional views showing the formation method of the wiring layer and the metal layer in the wiring member of FIG. 6 (Part 2)

Next, as shown in FIG. 8A, a bulk-raising metal plating layer 15c is formed on the metal plating layer 15b in the region R2 where the metal layer M should be disposed, by electrolytic plating using a seed layer 15a and the metal plating layer 15b as a plating power feed route. On this occasion, due to the metal plating layer 15b covered with the auxiliary resist pattern 19, the bulk-raising metal plating layer 15c is not formed in the region R1 where the wiring layers 15 should be disposed.

Figure 8B:
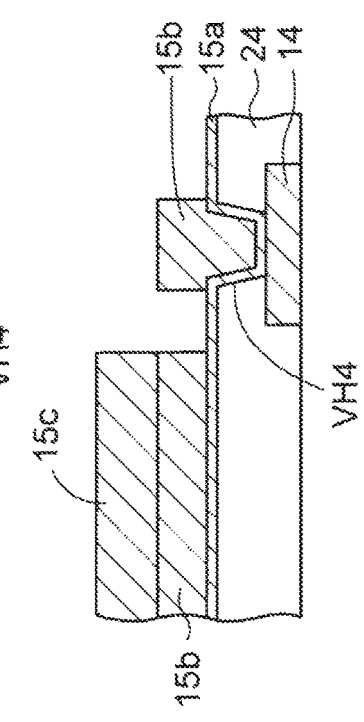

Then, as shown in FIG. 8B, the auxiliary resist pattern 19 and the plating resist layer 17 are removed.

Figure 8C:
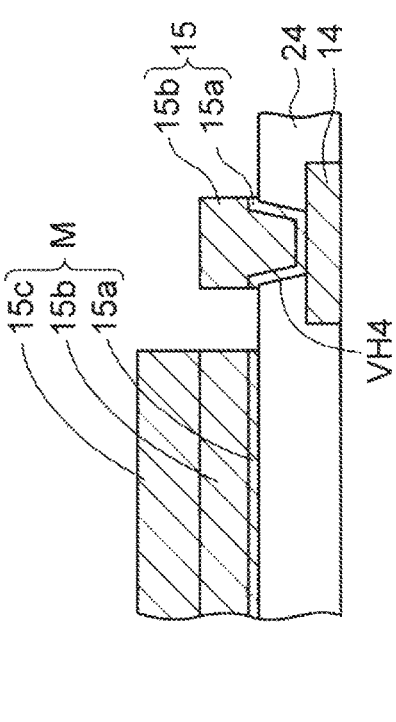

Further, as shown in FIG. 8C, the seed layer 15a is removed by etching with the bulk-raising metal plating layer 15c and the metal plating layer 15b as a mask.

Thus, the wiring layers 15 are formed from the seed layer 15a and the metal plating layer 15b. Simultaneously, the metal layer M is formed from the seed layer 15a, the metal plating layer 15b and the bulk-raising metal plating layer 15c. In this manner, the wiring layers 15, and the metal layer M thicker in thickness than the wiring layers 15 can be formed.

In the wiring member 5a according to the first modification, the auxiliary resist pattern 19 is formed additionally by a semi-additive method, so that the metal layer M can be set to be thicker in thickness than wiring layers 15 by a technique in which electrolytic plating is performed twice.

Thus, each of the wiring layers 15 can be set at a most suitable thickness as an electric wire, and the metal layer M can be set at a most suitable thickness as the heat radiation route and a ground layer. For example, the wiring layer 15 is set to be 15 μm to 20 μm thick, and the metal layer M is set to be 40 μm to 50 μm thick.

Figure 9:
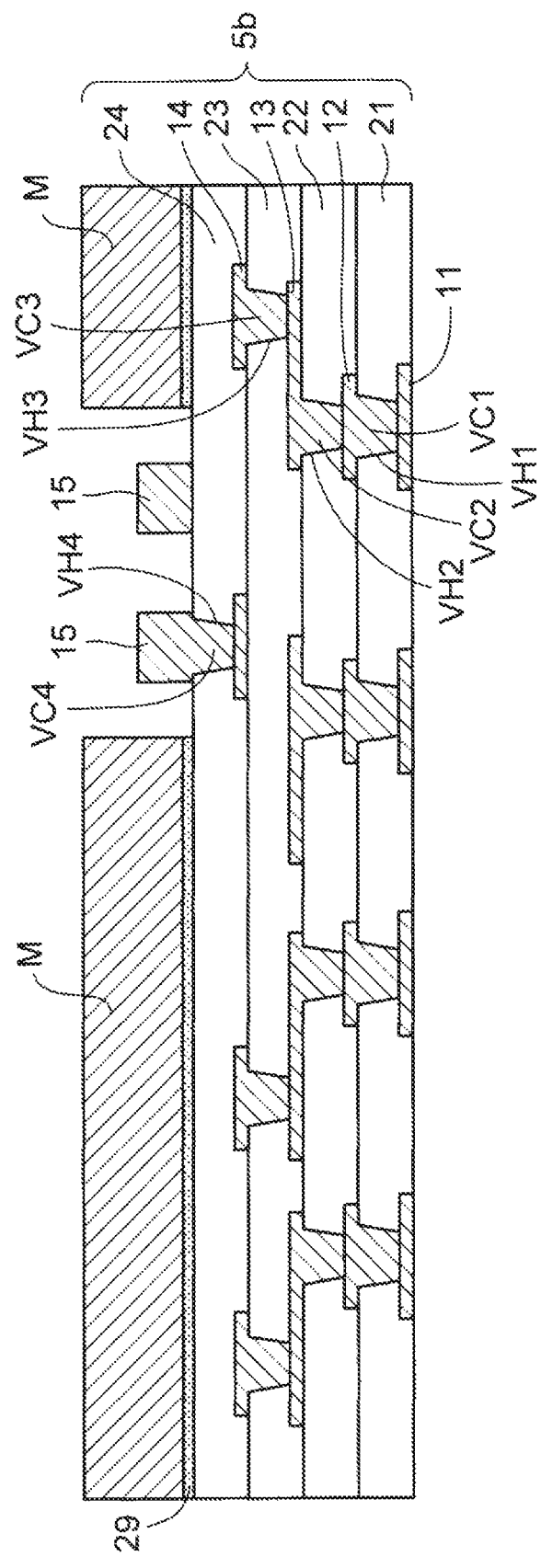
FIG. 9 is a sectional view showing a wiring member of a second modification that is used in the manufacturing method of an electronic component-embedded board according to the embodiment.

A wiring member 5b according to a second modification is shown in FIG. 9. In the wiring member 5b according to the second modification, wiring layers 15 are formed by a semi-additive method, and a metal plate is adhesively bonded on an insulating layer 24 by an adhesive layer 29 to thereby form a metal layer M.

A formation method of the wiring layers 15 and the metal layer M in the wiring member 5b according to the second modification will be described below. In the second modification, similar steps to or the same steps as the aforementioned steps in FIGS. 4A to 5A are executed as shown FIG. 10A to thereby form only the wiring layers 15 by the semi-additive method.

Successively, as shown in FIG. 10B, a metal plate Ma provided with opening portions Mx in portions corresponding to regions where the wiring layers 15 have been disposed is prepared. The metal plate Ma is formed from a copper plate etc., and the opening portions Mx are formed in the metal plate Ma by pressing or cutting.

Figure 11:
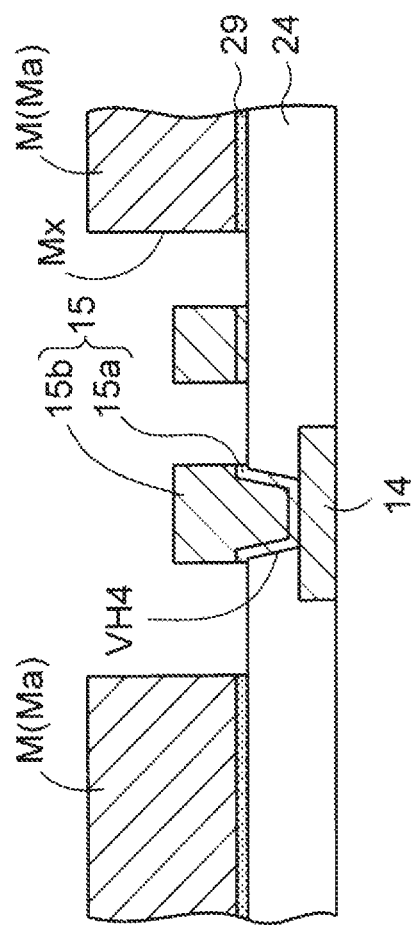
FIG. 11 is a sectional view showing the formation method of the wiring layer and the metal layer in the wiring member of FIG. 9 (Part 2)

As shown in FIG. 11, the opening portions Mx of the metal plate Ma are aligned with the regions where the wiring layers 15 have been disposed, and a lower surface of the metal plate Ma is adhesively bonded on an upper surface of the insulating layer 24 by the adhesive layer 29. Thus, the wiring layers 15 are disposed inside the opening portions Mx of the metal plate Ma, and the metal plate Ma is formed as the metal layer M.

As described above, the step of forming the metal layer M on the insulating layer 24 includes formation of the wiring layers 15 on the insulating layer 24. That is, after the wiring layers 15 are formed, the metal plate Ma is adhesively bonded on the insulating layer 24 to thereby obtain the metal layer M.

When the metal layer M is formed from the metal plate Ma, as shown in FIG. 9, the metal layer M is not connected to a lower-side wiring layer 14 through via conductors, but formed in an electrically floating state. Consequently, the metal layer M does not function as a ground layer.

In the wiring member 5b according to the second modification, the thickness of a plating resist layer 17 is reduced because it is unnecessary to take formation of the metal layer M into consideration when the wiring layers 15 are formed. As a result, the wiring patterns 15 can be formed to be fine.

Further, the metal layer M is formed from the metal plate Ma. Accordingly, the thickness of the metal layer M can be easily increased in comparison with the technique in which the metal layer M is formed simultaneously together with the wiring layers 15 by the semi-additive method. Consequently, heat radiation performance of the metal layer M can be improved.

For example, each of the wiring layers 15 can be formed into a fine pattern of a thin film that is as thin as 15 µm to 20 µm in thickness, and the metal layer M can be formed into a plain pattern of a thick film that is as thick as about 100 µm to about 200 µm in thickness.

Figure 12:
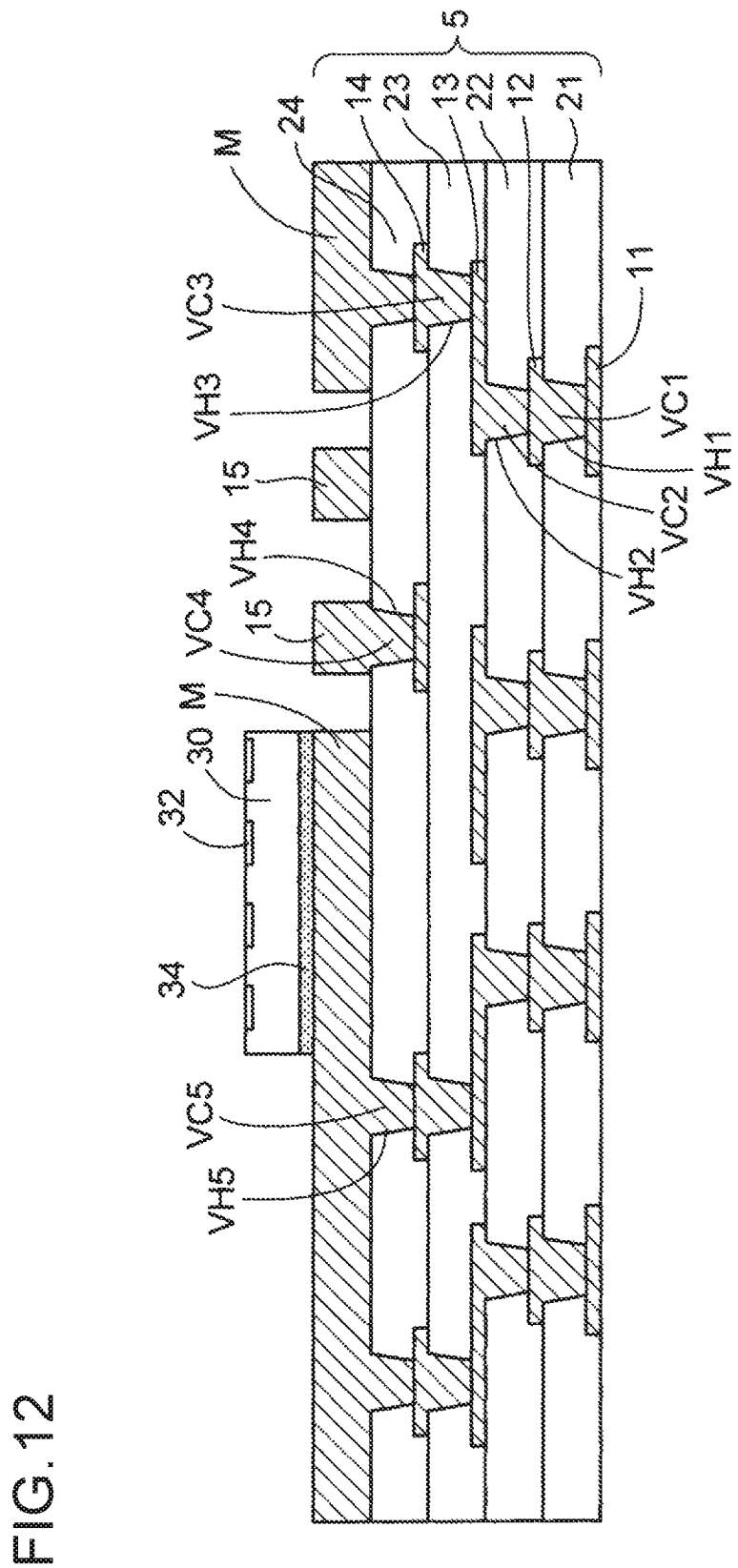
FIG. 12 is a sectional view showing the manufacturing method of the electronic component-embedded board according to the embodiment (Part 1)

In the following manufacturing method, the aforementioned wiring member 5 in FIG. 2 will be used and described. As shown in FIG. 12, a first semiconductor chip 30 is prepared, and a lower surface (back surface) of the semiconductor chip 30 is adhesively bonded on the metal layer M by a thermally conductive adhesive layer 34.

The first semiconductor chip 30 has connection terminals 32 provided in its upper surface (element formation surface). The connection terminals 32 of the first semiconductor chip 30 serve, for example, as metal pads made of copper etc. The connection terminals 32 of the first semiconductor chip 30 are exposed from opening portions of a protective insulating layer (not shown).

The first semiconductor chip 30 is an example of an electronic component that generates heat during operation. For example, the first semiconductor chip 30 is a CPU (Central Processing Unit) chip. In addition to the CPU chip, the heat-generating electronic component may be a GPU (Graphics Processing Unit) chip, a diode element, a memory chip, or the like.

The first semiconductor chip 30 is made thinner. The thickness of the first semiconductor chip 30 is in a range of 30 µm to 100 µm, e.g. about 50 µm.

Thus, the first semiconductor chip 30 is disposed on the metal layer M that is a portion of the heat radiation route so that heat generated from the semiconductor chip 30 can be radiated to the metal layer M. In this manner, the lower surface (back surface) of the first semiconductor chip is thermally bonded on the metal layer M.

Figure 13:
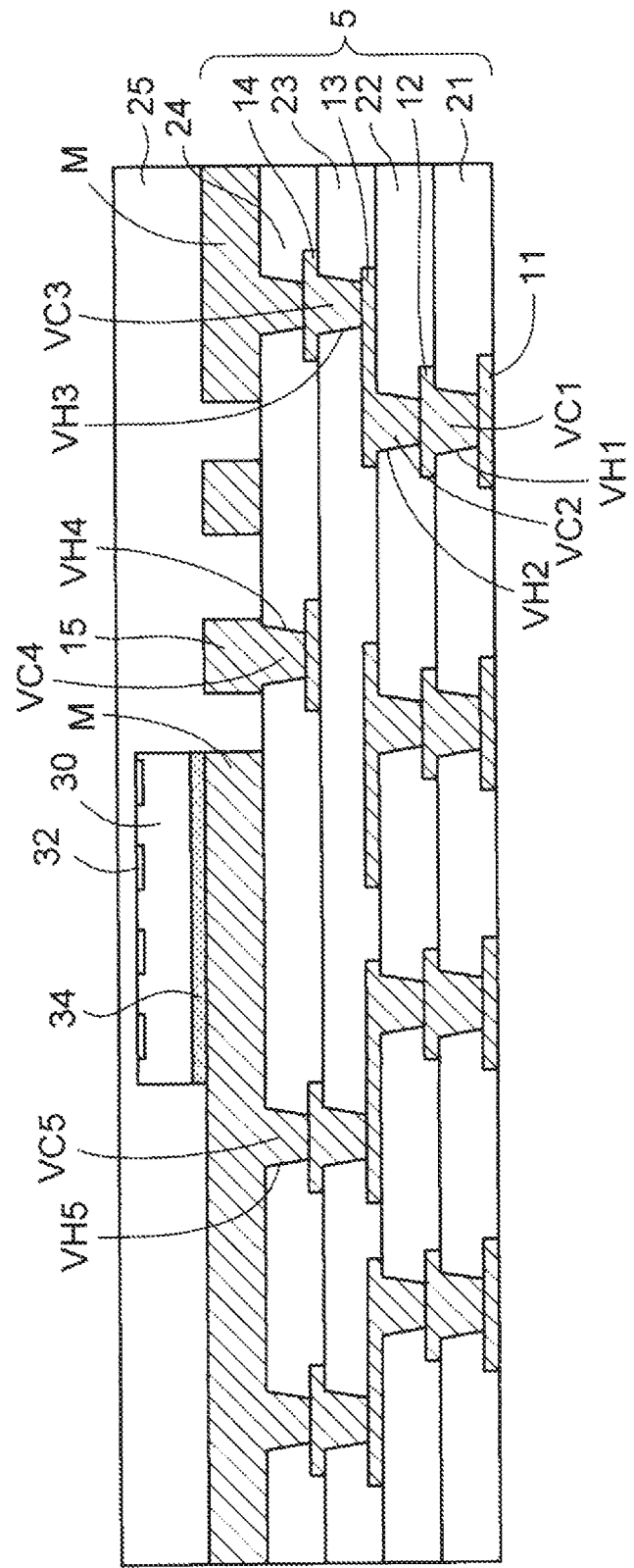
FIG. 13 is a sectional view showing the manufacturing method of the electronic component-embedded board according to the embodiment (Part 2)

Next, as shown in FIG. 13, a semi-cured insulating film is pasted onto the insulating layer 24, the wiring layers 15, the metal layer M and the first semiconductor chip 30 by a vacuum laminator, and subjected to heat treatment at a temperature of 180° C. to 200° C. so as to be cured.

Thus, an insulating layer 25 is formed on the insulating layer 24, the wiring layers 15 and the metal layer M such that the first semiconductor chip 30 is buried in the insulating layer 25. The insulating layer 25 is formed out of a thermosetting epoxy resin or polyimide resin etc.

Alternatively, a liquid resin may be applied by a squeegee etc. to thereby form the insulating layer 25.

When each of the thicknesses of the wiring layers 15 and the metal layer M is about 50 µm and the thickness of the first semiconductor chip 30 is about 50 µm, the insulating layer 25 is formed from an insulating film 100 µm to 200 µm thick in this step.

Thus, the first semiconductor chip 30 is entirely buried in the insulating layer 25 and an upper surface of the insulating layer 25 is formed flatly. The insulating layer 25 is formed with a minimum thickness in which the first semiconductor chip 30 can be buried.

Figure 14:
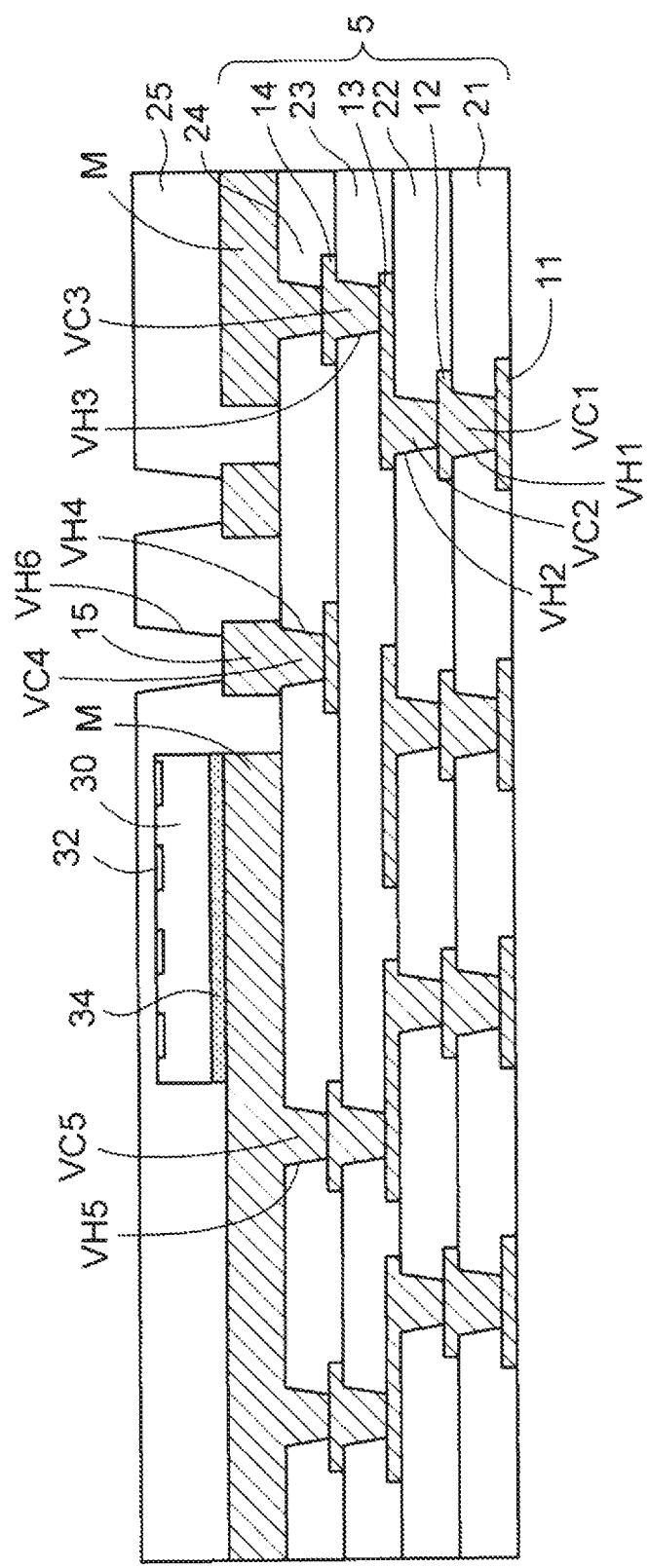
FIG. 14 is a sectional view showing the manufacturing method of the electronic component-embedded board according to the embodiment (Part 3)

Next, as shown in FIG. 14, the insulating layer 25 is processed by a laser so that via holes VH6 are formed in the insulating layer 25 to reach the wiring layers 15. Further, desmear treatment is performed by a permanganate method etc. to thereby remove and clean resin smears inside the via holes VH6.

Alternatively, a photosensitive resin layer may be formed, and exposed to light and developed based on photolithography so that the insulating layer 25 provided with the via holes VH6 is formed.

The insulating layers 21, 22, 23 and 24 in the aforementioned wiring member 5 of FIG. 2, an insulating layer in any subsequent step, and the via holes are also formed by a similar method to or the same method as the method of FIGS. 13 and 14.

Figure 15:
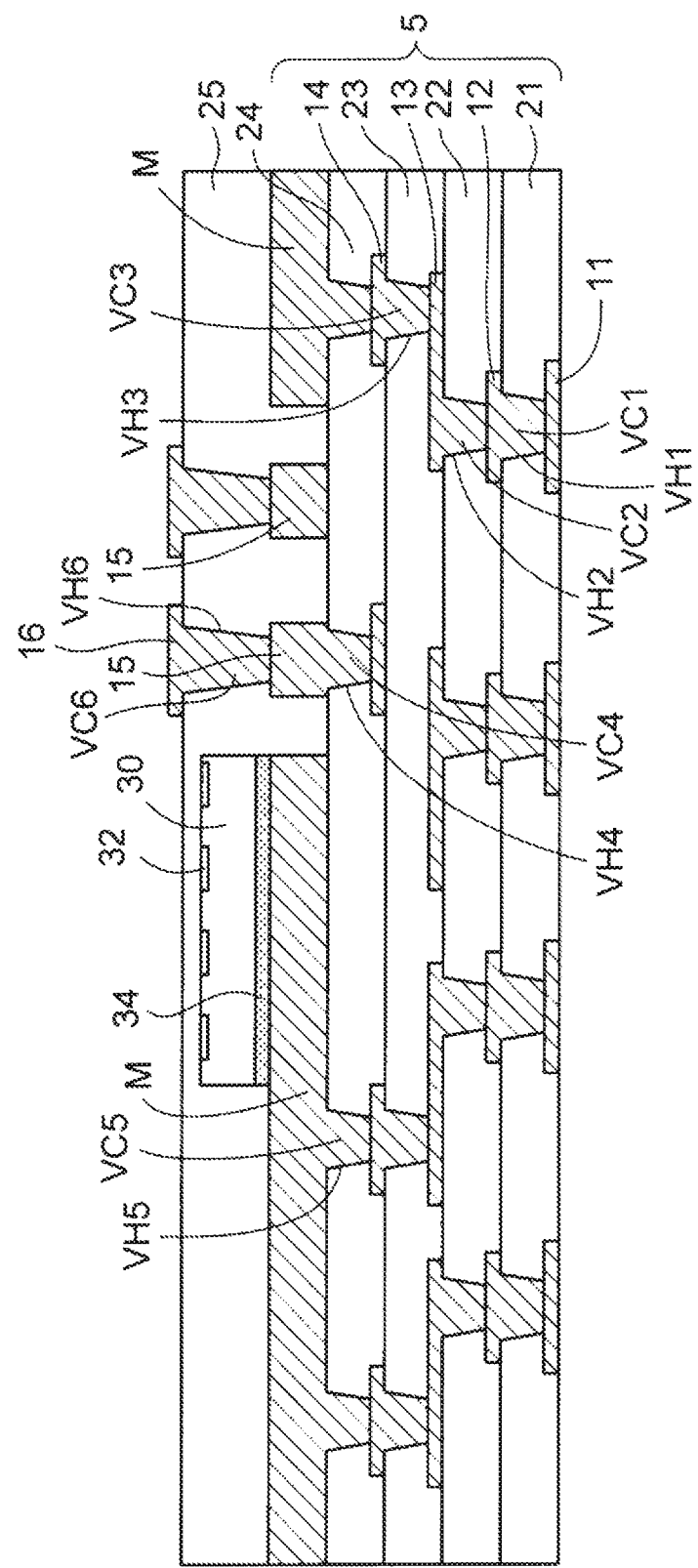
FIG. 15 is a sectional view showing the manufacturing method of the electronic component-embedded board according to the embodiment (Part 4)

Successively, as shown in FIG. 15, a wiring layer 16 is formed to be connected to the wiring layers 15 through via conductor VC6 inside the via holes VH6.

When the insulating layer 25 is formed with a film thickness in which the first semiconductor chip 30 can be fully buried, the insulating layer 25 formed on the wiring layers 15 is considerably thick in thickness. Therefore, the via holes VH6 on the wiring layers 15 are considerably deep in depth and an aspect ratio of the via holes VH6 is large.

When the aspect ratio of the via holes VH6 is large, the wiring layer 16 cannot be formed reliably, for example, due to voids generated in the via holes VH6 when the via conductors VC6 are buried in the via holes VH6 to form the wiring layer 16.

Therefore, in the embodiment, a two-stage stacked via structure is disposed on each of the wiring layers 15. With this configuration, the aspect ratio of the via holes on the wiring layers 15 can be suppressed. For such a reason, the insulating layer 25 can be formed with a minimum thickness in which the first semiconductor chip 30 can be buried, as described above.

In this manner, the via conductors VC6 in a first stage of the two-stage stacked via structure are disposed on the wiring layers 15.

Figure 16:
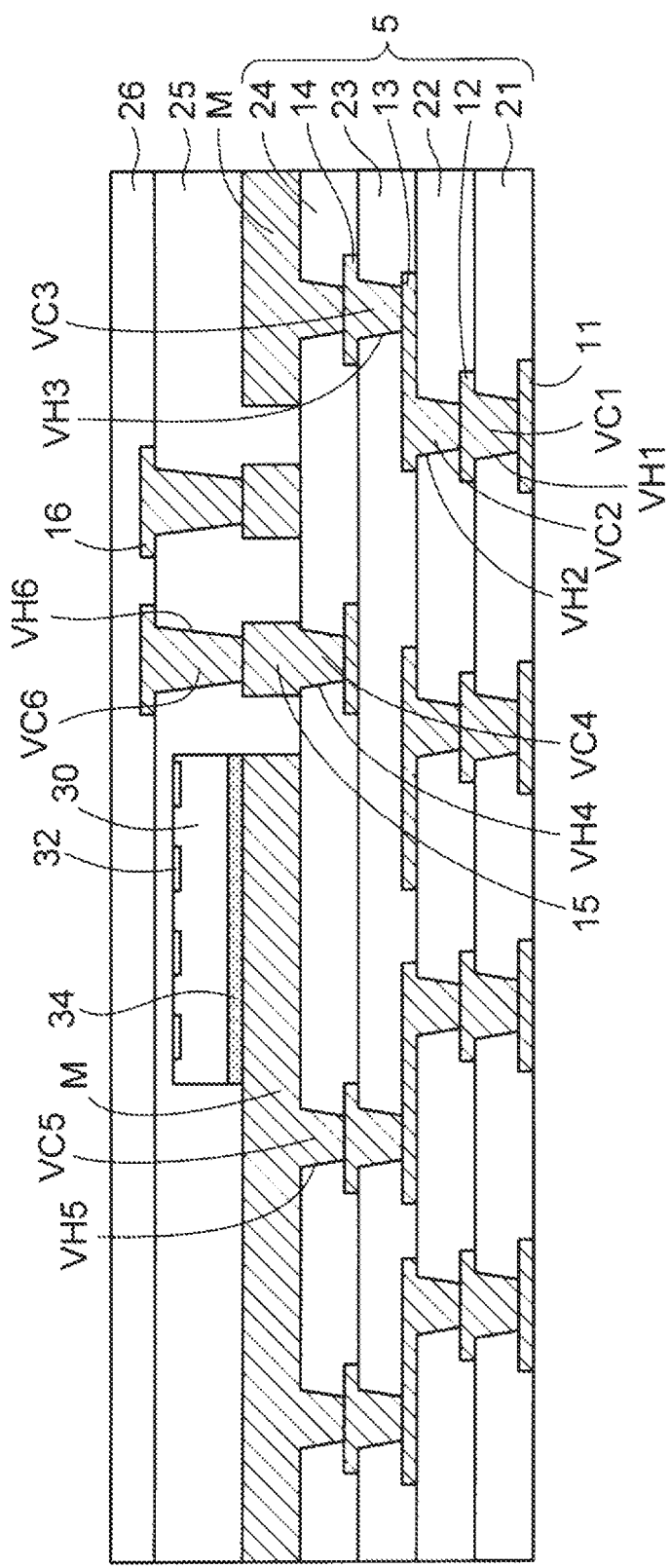
FIG. 16 is a sectional view showing the manufacturing method of the electronic component-embedded board according to the embodiment (Part 5)

Next, as shown in FIG. 16, an insulating layer 26 is formed on the insulating layer 25 and the wiring layer 16. The insulating layer 26 is set to be thinner in thickness than the insulating layer 25. The insulating layer 26 is formed, for example, with a thickness of about 5 µm to about 20 µm.

Figure 17:
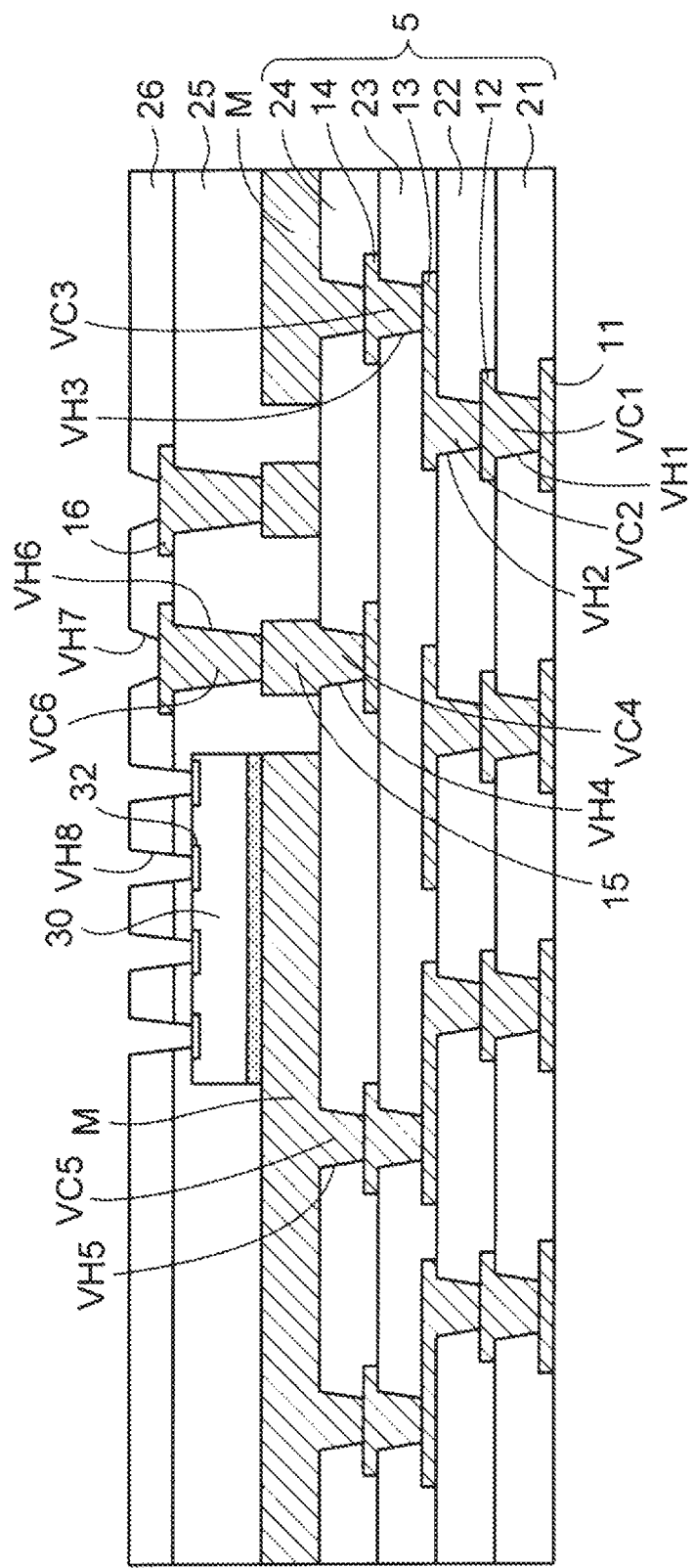
FIG. 17 is a sectional view showing the manufacturing method of the electronic component-embedded board according to the embodiment (Part 6)

Then, as shown in FIG. 17, the insulating layer 26 is processed by the laser so that via holes VH7 are formed in the insulating layer 26 to reach the wiring layer 16. In addition, the insulating layer 26 and the insulating layer 25 are processed by the laser so that via holes VH8 are formed in the insulating layer 26 and the insulating layer 25 to reach the connection terminals 32 of the first semiconductor chip 30.

On this occasion, the via holes VH7 on the top of the wiring layer 16 are disposed in a state in which the via holes VH7 are raised from the wiring layers 15 by the via conductors VC6 on the bottoms of the via holes VH7. Therefore, each of the via holes VH7 on the wiring layer 16 is formed into a shallow shape with a small aspect ratio in a similar manner to or the same manner as each of the via holes VH8 on the tops of the connection terminals 32 of the first semiconductor chip 30.

Figure 18:
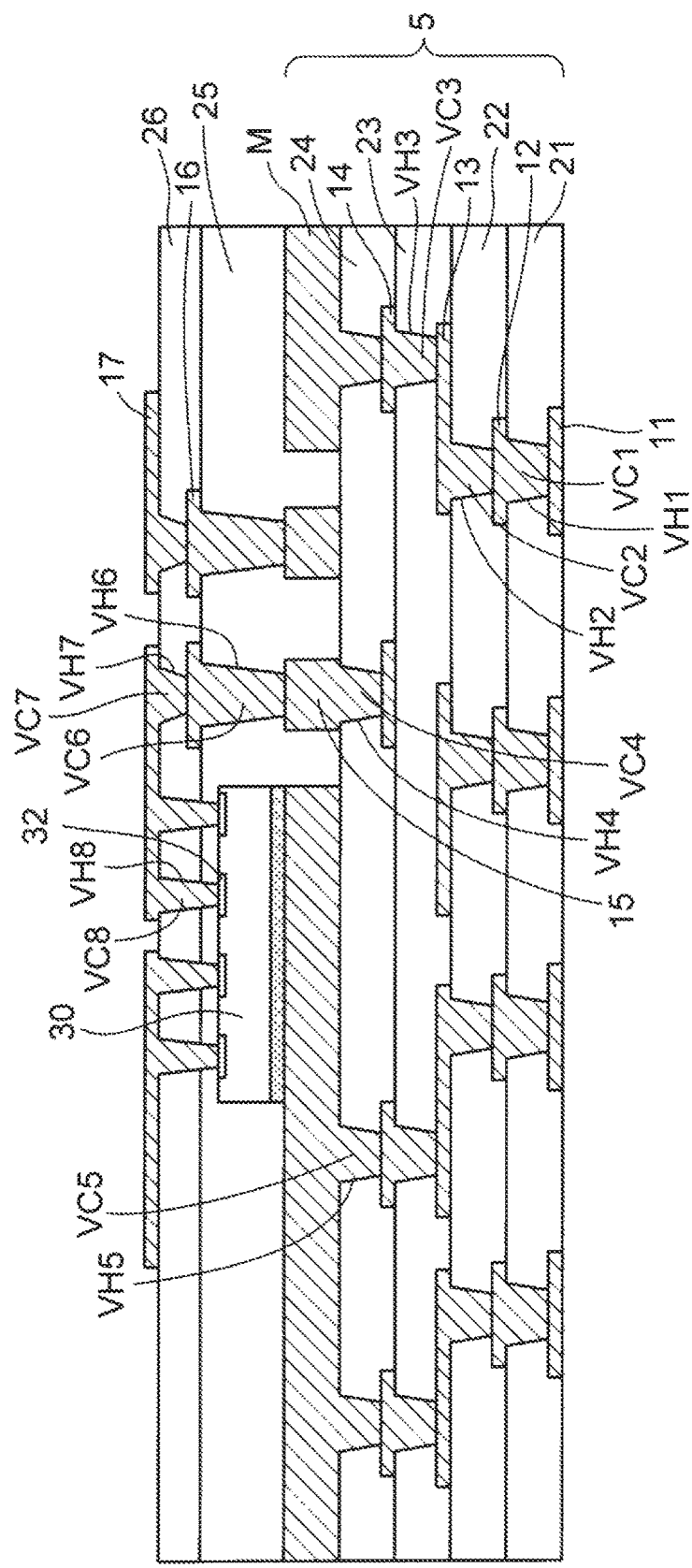
FIG. 18 is a sectional view showing the manufacturing method of the electronic component-embedded board according to the embodiment (Part 7)

Next, as shown in FIG. 18, a wiring layer 17 is formed on the insulating layer 26. The wiring layer 17 is connected to the wiring layer 16 through via conductors VC7 inside the via holes VH7. In addition, the wiring layer 17 is connected to the connection terminals 32 of the first semiconductor chip 30 through via conductors VC8 inside the via holes VH8. The wiring layer 17 is an example of a second wiring layer. In addition, each of the insulating layer 25 and the insulating layer 26 is an example of a second insulating layer.

Thus, in order to minimize the influence of the thickness of the first semiconductor chip 30, the two-stage stacked via structure is disposed on each of the wiring layers 15 disposed in a lateral direction of the first semiconductor chip 30. Thus, multilayered wiring layers can be formed reliably.

Figure 19:
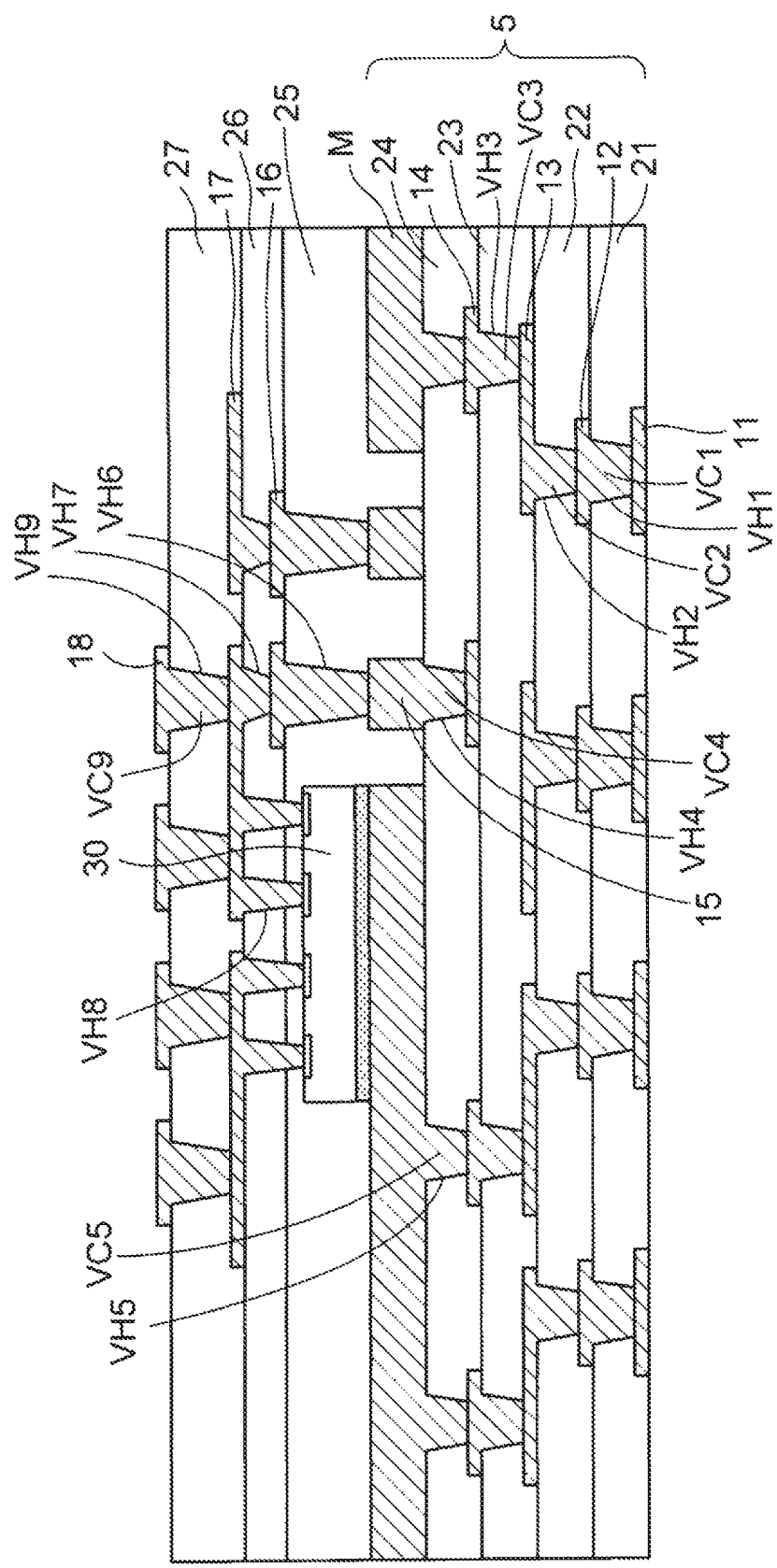
FIG. 19 is a sectional view showing the manufacturing method of the electronic component-embedded board according to the embodiment (Part 8)

Successively, as shown in FIG. 19, an insulating layer 27 is formed on the insulating layer 26 and the wiring layer 17. Further, the insulating layer 27 is processed by the laser so that via holes VH9 are formed in the insulating layer 27 to reach the wiring layer 17.

Further, as shown in FIG. 19, a wiring layer 18 is formed on the insulating layer 27 to be connected to the wiring layer 17 through via conductors VC9 inside the via holes VH9.

Figure 20:
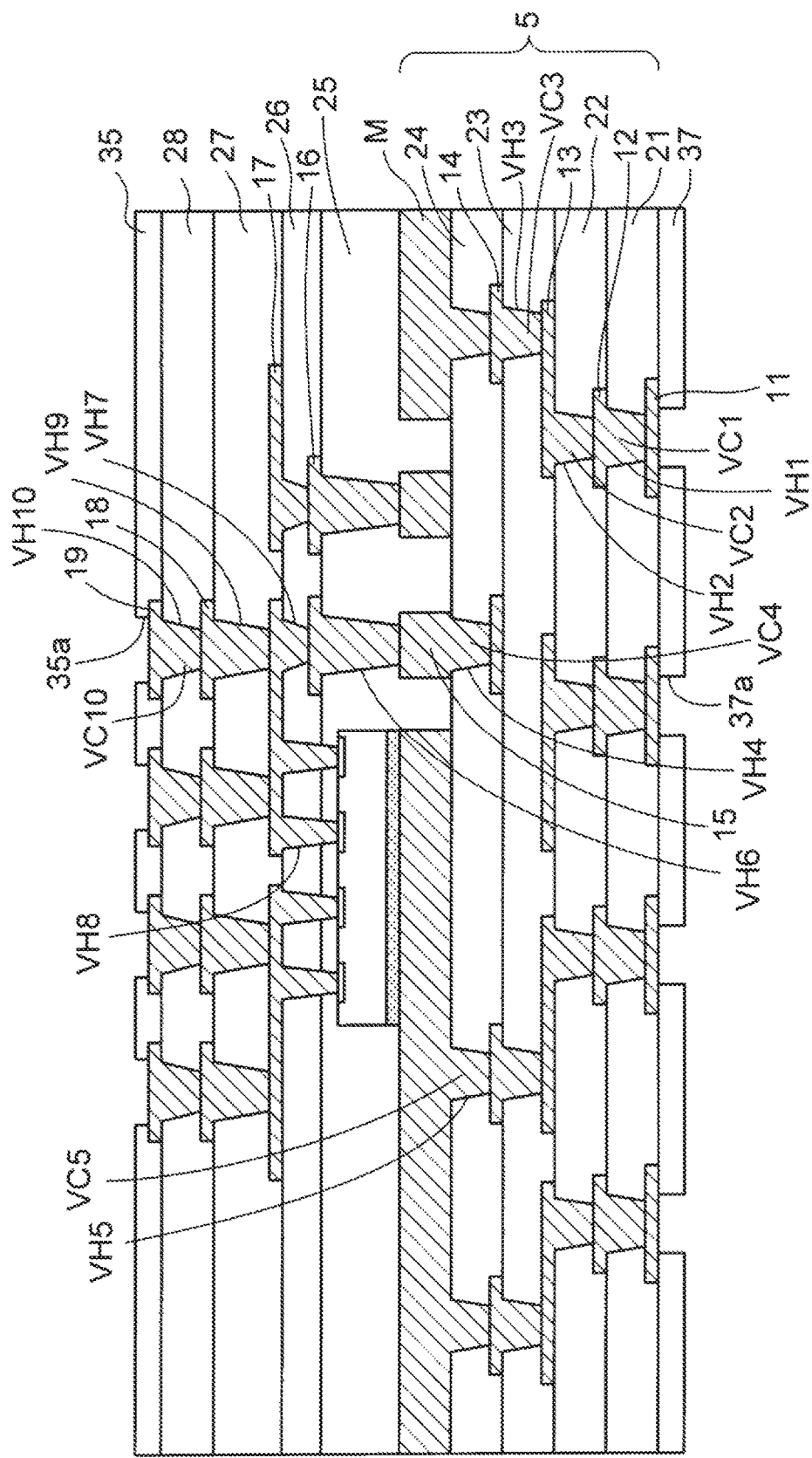
FIG. 20 is a sectional view showing the manufacturing method of the electronic component-embedded board according to the embodiment (Part 9)

Next, as shown in FIG. 20, an insulating layer 28 is formed on the insulating layer 27 and the wiring layer 18. Further, the insulating layer 28 is processed by the laser so that via holes VH10 are formed in the insulating layer 28 to reach the wiring layer 18.

Further, as shown in FIG. 20, a wiring layer 19 is formed on the insulating layer 28 to be connected to the wiring layer 18 through via conductors VC10 inside the via holes VH10.

Then, as shown in FIG. 20, a solder resist layer 35 provided with opening portions 35a on the tops of connection portions of the wiring layer 19 is formed on the top of the insulating layer 28. Further, a solder resist layer 37 provided with opening portions 37a on the bottoms of connection portions of the wiring layer 11 is formed on the bottom of the insulating layer 21.

Figure 21:
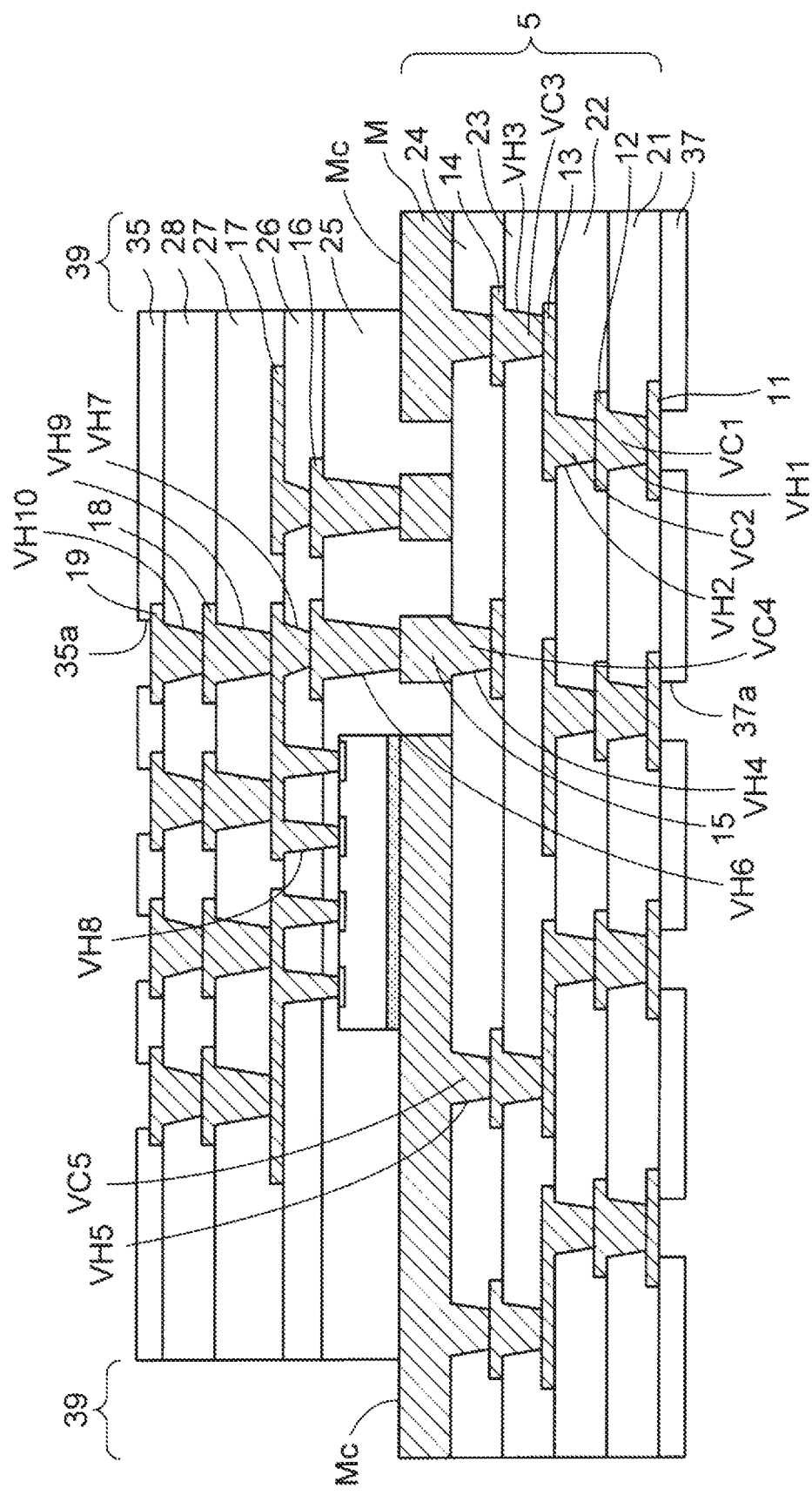
FIG. 21 is a sectional view showing the manufacturing method of the electronic component-embedded board according to the embodiment (Part 10)

Next, as shown in FIG. 21, a portion ranging from an upper surface of the solder resist layer 35 to a lower surface of the insulating layer 25 is removed by laser processing or by machining by a router etc. so that an opening portion 39 is formed. An outer circumferential portion of the metal layer M exposed in the opening portion 39 is used as a connection portion Mc to which a heat radiating member can be connected.

Figure 22:
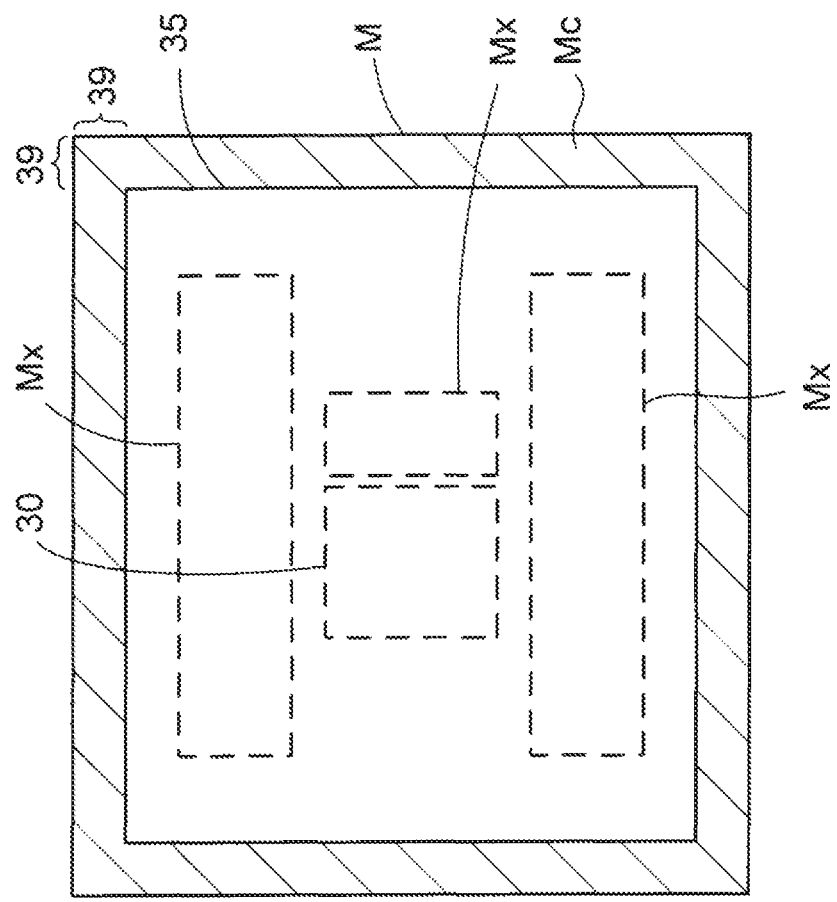
FIG. 22 is a plan view showing the manufacturing method of the electronic component-embedded board according to the embodiment (Part 11)

FIG. 22 is a schematic reduced plan view of the outlines of the metal layer M and the first semiconductor chip 30 in the structure body of FIG. 21 when seen from above. In FIG. 22, all the constituent members on and above the metal layer M and the first semiconductor chip 30 are omitted except that an external shape of the top solder resist layer 35 is shown.

As shown in FIG. 22, the ring-like outer circumferential portion of the metal layer M serves as the connection portion Mc (hatched region). The connection portion Mc is exposed in the opening portion 39 including the insulating layers 25, 26, 27 and 28 and the solder resist layer 35 (FIG. 20).

When the structure body in FIG. 20 is a large-sized board for producing a plurality of products, a plurality of product regions are defined in the large-sized board, and the large-sized board is cut into the product regions individually in the step of FIG. 21.

In the example of FIG. 22, the ring-like outer circumferential portion of the metal layer M is exposed to secure a large area of the connection portion Mc in order to satisfactorily radiate heat of an electronic component generating a large amount of the heat. However, it will go well as long as a required portion of the metal layer M can be exposed and used as the connection portion Mc so that the required portion of the metal layer M can be connected to the heat radiating member.

Figure 23:
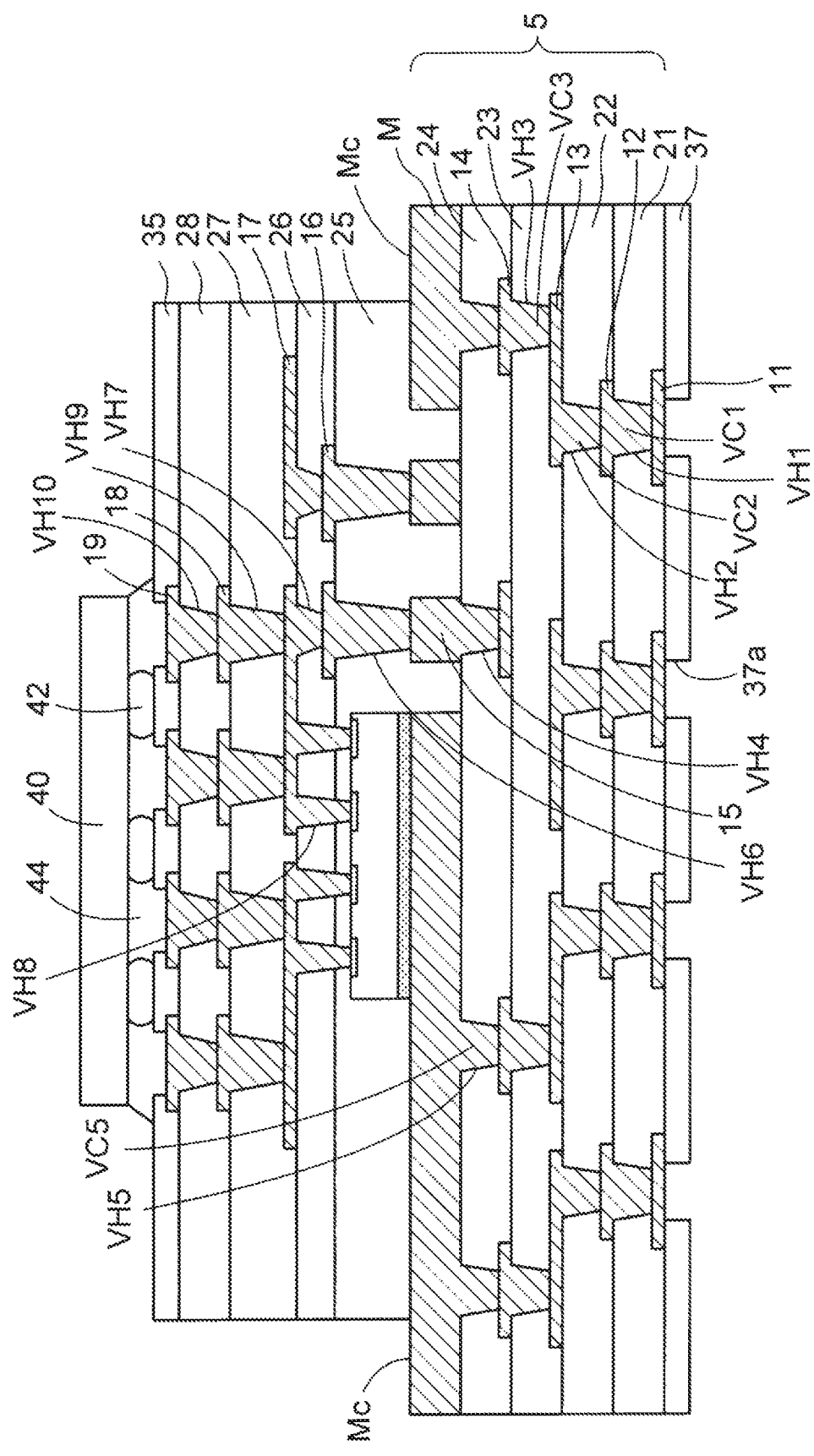
FIG. 23 is a sectional view showing the manufacturing method of the electronic component-embedded board according to the embodiment (Part 12)

Successively, as shown in FIG. 23, a second semiconductor chip 40 having connection terminals 42 provided at its lower surface (element formation surface) is prepared. The connection terminals 42 of the second semiconductor chip 40 are flip-chip connected to the connection portions of the wiring layer 19. The second semiconductor chip 40 is electrically connected to the wiring layer 17 (that is the example of the second wiring layer) through the wiring layer 19 and the wiring layer 18.

The connection terminals 42 of the second semiconductor chip 40 serve, for example, as bump electrodes such as solder bumps. Further, a space on a lower side of the second semiconductor chip 40 is filled with an underfill resin 44.

The second semiconductor chip 40 is disposed so that the first semiconductor chip 30 is disposed in a region right under the second semiconductor chip 40. Thus, a mounting area for the first semiconductor chip 30 and the second semiconductor chip 40 can be reduced in comparison with a case where the first semiconductor chip 30 and the second semiconductor chip 40 are disposed side by side in the lateral direction in plan view. Accordingly, the electronic component-embedded board can be miniaturized.

Incidentally, when the miniaturization of the electronic component-embedded board is not taken into consideration, the first semiconductor chip 30 and the second semiconductor chip 40 may be disposed at positions shifted from each other in plan view.

Figure 24:
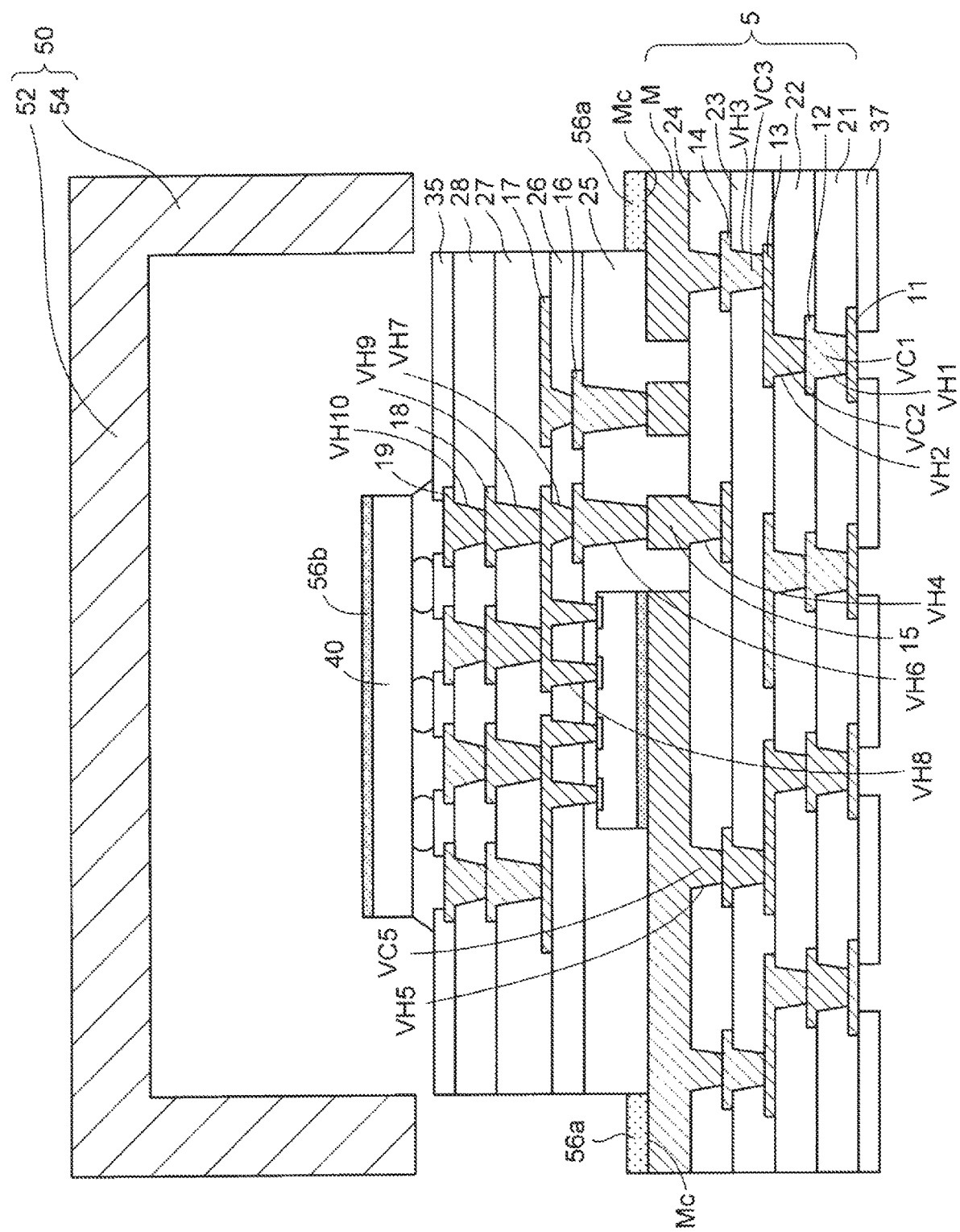
FIG. 24 is a sectional view showing the manufacturing method of the electronic component-embedded board according to the embodiment (Part 13)

Next, as shown in FIG. 24, a heat radiating member 50 is prepared. The heat radiating member 50 is formed from a top plate portion 52 shaped like a rectangle in plan view, and four side plate portions 54 protruding downward from the top plate portion 52 to support the four sides of the top plate portion 52. Thus, the heat radiating member 50 has a lid shape. A metal plate is pressed or cut to thereby manufacture the heat radiating member 50. The heat radiating member 50 is formed out of metal such as copper with high thermal conductivity.

A thermally conductive adhesive layer 56a is applied on the connection portion Mc of the metal layer M, and a thermally conductive adhesive layer 56b is applied onto an upper surface (back surface) of the second semiconductor chip 40. Further, the side plate portions 54 of the heat radiating member 50 are aligned with the connection portion Mc of the metal layer M.

Each of the side plate portions 54 of the heat radiating member 50 is set to have such a height that a lower surface of the top plate portion 52 can abut against the upper surface (back surface) of the second semiconductor chip 40 when the side plate portions 54 of the heat radiating member 50 are adhesively bonded on the connection portion Mc of the metal layer M.

As shown in FIG. 25, the side plate portions 54 of the heat radiating member 50 are connected to the connection portion Mc of the metal layer M through the thermally conductive adhesive layer 56a. On this occasion, the lower surface of the top plate portion 52 of the heat radiating member 50 is simultaneously connected to the upper surface (back surface) of the second semiconductor chip 40 through the thermally conductive adhesive layer 56b.

Thus, the side plate portions 54 of the heat radiating member 50 are thermally bonded on the connection portion Mc of the metal layer M. In addition, the top plate portion 52 of the heat radiating member 50 is thermally bonded on the upper surface (back surface) of the second semiconductor chip 40.

An insulating ceramic filler-containing resin is used as the material of the thermally conductive adhesive layer 56a through which the metal layer M and the heat radiating member 50 are connected to each other. Alumina or aluminum nitride is used as the ceramic. An epoxy resin, a polyimide resin or a silicon resin is used as the resin.

Alternatively, when the metal layer M and the heat radiating member 50 may be electrically connected to each other, an electrically semi-conductive metal paste-containing resin may be used as the material of the thermally conductive adhesive layer 56a. The metal of the metal paste-containing resin can be made of silver (Ag) etc. An epoxy resin, a polyimide resin or a silicon resin can be used as the resin.

In addition, when the metal layer M and the heat radiating member 50 may be electrically connected to each other, an electrically conductive solder may be used as the material of the thermally conductive adhesive layer 56a.

As another method to replace the use of the thermally conductive adhesive layer 56a, the side plate portions 54 of the heat radiating member 50 may be brought into mechanical contact and connection with the connection portion Mc of the metal layer M by screws etc.

In addition, a ceramic filler-containing resin is preferably used as the material of the thermally conductive adhesive layer 56b through which the heat radiating member 50 and the second semiconductor chip 40 are connected to each other. Alternatively, when an insulating layer is formed on the upper surface (back surface) of the second semiconductor chip 40 so that the second semiconductor chip 40 can be satisfactorily insulated, a metal paste-containing resin or a solder may be used as the material of the thermally conductive adhesive layer 56b.

In a similar manner or the same manner, a ceramic filler-containing resin is preferably used as the material of the thermally conductive adhesive layer 34 through which the aforementioned first semiconductor chip 30 of FIG. 13 is connected to the metal layer M. Alternatively, when an insulating layer is formed on the lower surface (back surface) of the first semiconductor chip 30 so that the first semiconductor chip 30 can be satisfactorily insulated, a metal paste-containing resin or a solder may be used as the material of the thermally conductive adhesive layer 34.

In the aforementioned manner, an electronic component-embedded board 1 according to the embodiment is manufactured.

As shown in FIG. 25, the electronic component-embedded board 1 according to the embodiment is provided with the wiring member 5 having the aforementioned structure which has been described in FIG. 2. The insulating layer 24 on the bottom of the metal layer M of the wiring member 5 is the example of the first insulating layer. In addition, each of the wiring layers 15 of the wiring member 5 is the example of the first wiring layer.

Although the wiring member 5 in FIG. 25 is a coreless wiring member having no core substrate, the wiring member 5 may be a rigid type wiring member in which multilayered wiring layers are formed on each of opposite surface sides of a core substrate made of a glass epoxy resin etc.

The lower surface (back surface) of the first semiconductor chip 30 is disposed on the metal layer M of the wiring member 5 so as to be adhesively bonded thereto by the thermally conductive adhesive layer 34. The first semiconductor chip 30 is an electronic component that generates heat during operation. The first semiconductor chip 30 is, for example, a CPU chip. The first semiconductor chip 30 is provided with the connection terminals 32 in its upper surface (element formation surface).

The insulating layer 25 is formed on the wiring layers 15 and the metal layer M so that the first semiconductor chip 30 is buried in the insulating layer 25. The via holes VH6 are formed in the insulating layer 25 to reach the wiring layers 15. The wiring layer 16 is formed on the insulating layer 25 to be connected to the wiring layers 15 through the via conductors VC6 inside the via holes VH6.

As described above, when the insulating layer 25 is formed as a thick film so that the first semiconductor chip 30 can be fully buried in the insulating layer 25, the aspect ratio of the via holes VH6 formed in the insulating layer 25 is large. As a result, it is difficult to fill the via holes VH6 with the via conductors VC6 reliably.

As a measure against the aforementioned problem, the insulating layer 25 is formed with a minimum thickness in which the first semiconductor chip 30 can be buried, and the two-stage stacked via structure is formed on each of the wiring layers 15. Thus, an increase in the aspect ratio of the via holes VH6 on the wiring layers 15 can be suppressed.

Thus, the via conductors VC6 in the first stage of the two-stage stacked via structure are disposed on the wiring layers 15.

In addition, the insulating layer 26 thinner in thickness than the insulating layer 25 is formed on the insulating layer 25 and the wiring layer 16. Each of the insulating layer 25 and the insulating layer 26 is the example of the second insulating layer.

The via holes VH7 are formed in the insulating layer 26 to reach the wiring layer 16. The wiring layer 17 is formed on the insulating layer 26 to be connected to the wiring layer 16 through the via conductors VC7 inside the via holes VH7.

Thus, the via conductors VC6 for the wiring layer 16 of the first stage and the via conductors VH7 for the wiring layer 17 of a second stage are stacked on the wiring layers 15 so that the two-stage stacked via structure is constructed.

On the other hand, in a region on the first semiconductor chip 30, the via holes VH8 are formed in the insulating layer 26 and the insulating layer 25 to reach the connection terminals 32 of the first semiconductor chip 30. The wiring layer 17 is connected to the connection terminals 32 of the first semiconductor chip 30 through the via conductors VC8 inside the via holes VH8.

As described above, an increase in the aspect ratio of the via holes caused by the two-stage stacked via structure can be suppressed in the region on the wiring layers 15 disposed in the lateral direction of the first semiconductor chip 30. Thus, via connection can be constructed reliably.

In addition, the insulating layer 27 is formed on the insulating layer 26 and the wiring layer 17. The via holes VH9 are formed in the insulating layer 27 to reach the wiring layer 17. The wiring layer 18 is formed on the insulating layer 27. The wiring layer 18 is connected to the wiring layer 17 through the via conductors VC9 inside the via holes VH9.

In a similar manner or the same manner, the insulating layer 28 is formed on the insulating layer 27 and the wiring layer 18. The via holes VH10 are formed in the insulating layer 28 to reach the wiring layer 18. The wiring layer 19 is formed on the insulating layer 28. The wiring layer 19 is connected to the wiring layer 18 through the via conductors VC10 inside the via holes VH10.

In addition, the solder resist layer 35 provided with the opening portions 35a on the tops of the connection portions of the wiring layer 19 is formed on the top of the insulating layer 28. Further, the solder resist layer 37 provided with the opening portions 37a on the bottoms of the connection portions of the wiring layer 11 is formed on the bottom of the insulating layer 21 on the lower surface side of the wiring member 5.

In addition, the connection terminals 42 of the second semiconductor chip 40 are flip-chip connected to the connection portions of the wiring layer 19. Further, the space on the lower side of the second semiconductor chip 40 is filled with the underfill resin 44. The second semiconductor chip 40 is another example of the electronic component that generates heat during operation. The second semiconductor chip 40 is, for example, a CPU chip.

In the example of the embodiment, multilayered wiring layers, i.e. the three wiring layers (the wiring layers 17, 18 and 19) are formed on the first semiconductor chip 30, as shown in FIG. 25. However, the number of formed layers can be set desirably. The second semiconductor chip 40 may be flip-chip connected to any of the wiring layers on the first semiconductor chip 30.

Thus, the second semiconductor chip 40 is electrically connected to the wiring layer 17 (the example of the second wiring layer) connected to the connection terminals 32 of the first semiconductor chip 30.

In addition, the opening portion 39 is formed to extend from the solder resist layer 35 to the insulating layers 25 and 26 (each of which is the example of the second insulating layer). The portion of the metal layer M exposed in the opening portion 39 serves as the connection portion Mc. Preferably, the ring-like outer circumferential portion of the metal layer M serves as the connection portion Mc, as in the aforementioned FIG. 22.

The heat radiating member 50 is connected to the connection portion Mc of the metal layer M of the wiring member 5. The heat radiating member 50 is formed from the top plate portion 52 and the four side plate portions 54 protruding downward from the top plate portion 52 to support the four sides of the top plate portion 52. Front end surfaces of the side plate portions 54 of the heat radiating member 50 are connected to the connection portion Mc of the metal layer M through the thermally conductive adhesive layer 56a.

Further, the upper surface (back surface) of the second semiconductor chip 40 is connected to the lower surface of the top plate portion 52 of the heat radiating member 50 by the thermally conductive adhesive layer 56b.

The first semiconductor chip 30 has a characteristic of generating heat during operation. The heat generated from the first semiconductor chip 30 is conducted to the metal layer M through the thermally conductive adhesive layer 34, conducted to the heat radiating member 50 through the thermally conductive adhesive layer 56a disposed on the connection portion Mc of the metal layer M, and radiated to the outside.

In addition, the second semiconductor chip 40 also has a characteristic of generating heat during operation. The heat generated from the second semiconductor chip 40 is conducted to the heat radiating member 50 through the thermally conductive adhesive layer 56b and radiated to the outside.

Thus, the heat radiating member 50 is thermally bonded to the first semiconductor chip 30 and the second semiconductor chip 40. The first semiconductor chip 30 is buried in the insulating layer 25. The second semiconductor chip 40 is received inside the heat radiating member 50 and flip-chip connected to the connection portions of the wiring layer 19. Thus, the heat radiating member 50 functions as the heat radiation route shared by the first semiconductor chip 30 and the second semiconductor chip 40.

Since the heat radiating member 50 is connected to the metal layer M on which the first semiconductor chip 30 is disposed, heat radiation performance can be improved more remarkably than a structure in which heat is radiated to the outside only through the metal layer M.

Thus, an electronic component such as a CPU chip that generates a large amount of heat can be buried and embedded in an insulating layer of a multilayered wiring substrate.

In addition, the heat radiating member 50 has the lid shape in which the side plate portions 54 are formed on the rectangular top plate portion 52. Therefore, the upper surface (back surface) of the second semiconductor chip 40 disposed at the top and the lower surface of the top plate portion 52 of the heat radiating member 50 are connected to each other so that the heat radiating member 50 can serve as the heat radiation route for the second semiconductor chip 40.

Thus, the metal layer M inside the multilayered wiring substrate and the heat radiating member 50 are connected to each other. Accordingly, an integral heat radiation route for the buried first semiconductor chip 30 and the top second semiconductor chip 40 can be constructed.

FIG. 26 is a schematic reduced plan view of FIG. 25 when seen from above. In FIG. 26, the second semiconductor chip 40 and the first semiconductor chip 30 which are disposed on the lower side of the heat radiating member 50 are shown in perspective, and the respective constituent members of the multilayered wiring substrate are omitted.

When the plan view of FIG. 26 is added to FIG. 25 for reference, the first semiconductor chip 30 buried in the insulating layer 25 is disposed just below the second semiconductor chip 40. Thus, the mounting area can be reduced in comparison with a case where the first semiconductor chip 30 and the second semiconductor chip 40 are disposed side by side laterally. Accordingly, the electronic component-embedded board can be miniaturized.

In the example of FIG. 26, the first semiconductor chip 30 has a smaller area than that of the second semiconductor chip 40, and is disposed to overlap with a region within the second semiconductor chip 40 in plan view.

In addition to this example, the first semiconductor chip 30 may have a larger area than that of the second semiconductor chip 40, and the first semiconductor chip 30 may be disposed such that a portion of the first semiconductor chip 30 is extended from the second semiconductor chip 40 in plan view. Further, a plurality of first semiconductor chips 30 may be disposed within the second semiconductor chip 40 in plan view.

In addition, an electronic component-embedded board having a similar structure or the same structure can be constructed by use of the aforementioned wiring member 5a according to the first modification in FIG. 6. When the wiring member 5a according to the first modification in FIG. 6 is used, the metal layer M is set to be thicker in thickness than the wiring layers 15. Accordingly, heat radiation performance of heat generated from the first semiconductor chip 30 can be improved more greatly.

FIG. 27 shows an electronic component-embedded board 1a in which the aforementioned wiring member 5b according to the second modification in FIG. 9 is used. The electronic component-embedded board 1a in FIG. 27 is the same as the electronic component-embedded board 1 in FIG. 25 except that the metal layer M is formed from the metal plate Ma (FIG. 10B). Therefore, the other constituent members of the electronic component-embedded board 1a will be omitted.

In the electronic component-embedded board 1a in FIG. 27, the metal plate Ma thicker in thickness is adhesively bonded to thereby form the metal layer M. Accordingly, the metal layer M can be formed with higher heat radiation performance than a method in which the metal layer M is formed by a plating method.

Therefore, a highly reliable electronic component-embedded board can be made, for example, when a plurality of electronic components each of which generates a large amount of heat are disposed on the metal layer M.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing an electronic component-embedded board, the method comprising:
 a) forming a metal layer on a first insulating layer;
 b) disposing a first electronic component on the metal layer;
 c) forming a second insulating layer on the first insulating layer and the metal layer such that the first electronic component is embedded in the second insulating layer;
 d) removing a portion of the second insulating layer to expose a portion of the metal layer from the second insulating layer;
 e) disposing a second electronic component above the second insulating layer; and
 f) disposing a heat radiating member such that the heat radiating member is thermally connected to the metal layer exposed from the second insulating layer and thermally connected to the second electronic component.

2) The method according to clause (1), wherein
 the step (a) comprises forming a first wiring layer and the metal layer on the first insulating layer simultaneously, and
 the step (a) further comprises:
 forming a seed layer on the first insulating layer;
 forming a plating resist layer having an opening portion on the seed layer;
 forming a metal plating layer in the opening portion of the plating resist layer by electrolytic plating;
 removing the plating resist layer; and
 etching the seed layer using the metal plating layer as a mask.

3) The method according to clause (1), wherein
 the step (a) comprises forming a first wiring layer and the metal layer on the first insulating layer, and
 the step (a) further comprises:
 forming a seed layer on the first insulating layer;
 forming a plating resist layer having an opening portion on the seed layer;
 forming a metal plating layer in the opening portion of the plating resist layer by electrolytic plating;
 removing the plating resist layer;
 etching the seed layer using the metal plating layer as a mask; and
 bonding a metal plate onto the first insulating layer so as to obtain the metal layer.

4) The method according to clause (2), wherein the metal layer is thicker in thickness than the first wiring layer.

5) The method according to clause (1), wherein, in the step (e), the second electronic component is disposed above the second insulating layer such that the second electronic component overlaps with the first electronic component in plan view.

What is claimed is:

1. An electronic component-embedded board comprising:
 a first insulating layer;
 a metal layer formed on the first insulating layer;
 a first electronic component disposed on the metal layer;
 a second insulating layer formed on the first insulating layer and the metal layer such that the first electronic component is buried in the second insulating layer;
 a second electronic component disposed above the second insulating layer; and
 a heat radiating member thermally connected to the metal layer exposed from the second insulating layer and thermally connected to the second electronic component.

2. The electronic component-embedded board according to claim 1, further comprising:
 a first wiring layer formed on the first insulating layer,
 wherein each of the metal layer and the first wiring layer comprises a seed layer and a metal plating layer formed on the seed layer.

3. The electronic component-embedded board according to claim 1, further comprising:
 a first wiring layer formed on the first insulating layer,
 wherein the first wiring layer comprises a seed layer and a metal plating layer formed on the seed layer, and
 the metal layer is made of a metal plate that is bonded to the first insulating layer.

4. The electronic component-embedded board according to claim 2, wherein the metal layer is thicker in thickness than the first wiring layer.

5. An electronic component-embedded board according to claim 3, wherein: the metal layer is thicker in thickness than the first wiring layer.

6. The electronic component-embedded board according to claim 1, wherein the second electronic component overlaps with the first electronic component in plan view.

7. The electronic component-embedded board according to claim 1, further comprising:
 a second wiring layer formed on the second insulating layer,
 wherein a lower surface of the first electronic component is bonded to the metal layer, and the first electronic component includes a connection terminal provided in an upper surface of the first electronic component,
 the second electronic component is electrically connected to the second wiring layer, and the second wiring layer is connected to the connection terminal of the first electronic component through a via conductor formed in the second insulating layer.

8. The electronic component-embedded board according to claim 1, wherein the heat radiating member is exposed to the outside, and disposed on the metal layer exposed from the second insulating layer to cover the first electronic component, the second electronic component, and the second insulating layer.

9. The electronic component-embedded board according to claim 1, wherein an outer circumferential portion of the metal layer is exposed from the second insulating layer.

* * * * *